United States Patent
Shim

(10) Patent No.: US 6,441,756 B1
(45) Date of Patent: Aug. 27, 2002

(54) METHOD OF MODULATING AND/OR DEMODULATING RLL CODE HAVING ENHANCED DIRECT CURRENT SUPPRESSION CAPABILITY

(75) Inventor: Jae-seong Shim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/946,784

(22) Filed: Sep. 6, 2001

(30) Foreign Application Priority Data

Sep. 6, 1960 (KR) ........................................ 2000-52660

(51) Int. Cl.$^7$ ................................................ H03M 7/00
(52) U.S. Cl. ............................ 341/59; 341/58; 341/106
(58) Field of Search ............................ 341/58, 59, 106

(56) References Cited

U.S. PATENT DOCUMENTS

| | | | | |
|---|---|---|---|---|
| 4,520,346 A | * | 5/1985 | Shimada ...................... | 341/58 |
| 5,696,505 A | * | 12/1997 | Schouhamer Immink .... | 341/59 |
| 5,790,056 A | * | 8/1998 | Schouhamer Immink .... | 341/58 |
| 5,818,367 A | * | 10/1998 | Okazaki et al. ............. | 341/106 |
| 6,150,964 A | * | 11/2000 | McLaughlin ................. | 341/56 |
| 6,195,764 B1 | * | 2/2001 | Caldara et al. ............... | 703/13 |
| 6,268,810 B1 | * | 7/2001 | Shim et al. .................. | 341/106 |
| 6,281,815 B1 | * | 8/2001 | Shim et al. .................. | 341/106 |

* cited by examiner

Primary Examiner—Michael Tokar
Assistant Examiner—Khai Nguyen
(74) Attorney, Agent, or Firm—Staas & Halsey LLP

(57) ABSTRACT

A method of modulating and a method of demodulating for a run length limited (RLL) code having an improved direct current (DC) suppression capability. Received data is modulated using a DC suppression control code group which is separate from a data modulation conversion code group. The DC suppression control code group maximizes use of the characteristics of codewords in conversion code groups, such as, the sign of parameter CSV representing the DC value within a codeword and the characteristics of parameter INV predicting the DSV transition direction of the next codeword, while relaxing the redundant codeword generation condition or the condition of usable codewords compared with the data modulation conversion code group. Therefore, the number of codewords increases, so that the probability of DC suppression control further increases.

34 Claims, 17 Drawing Sheets

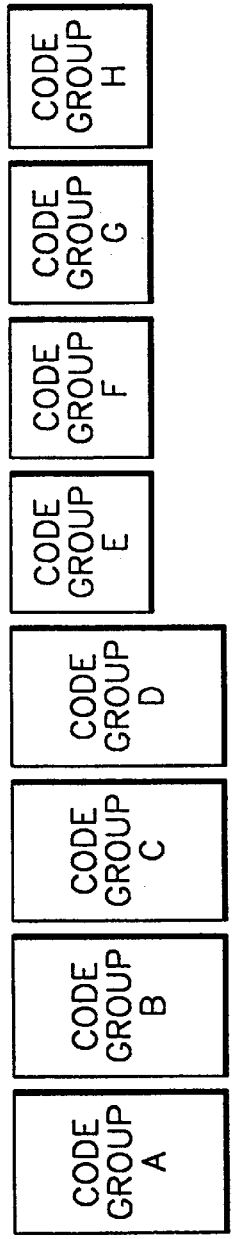

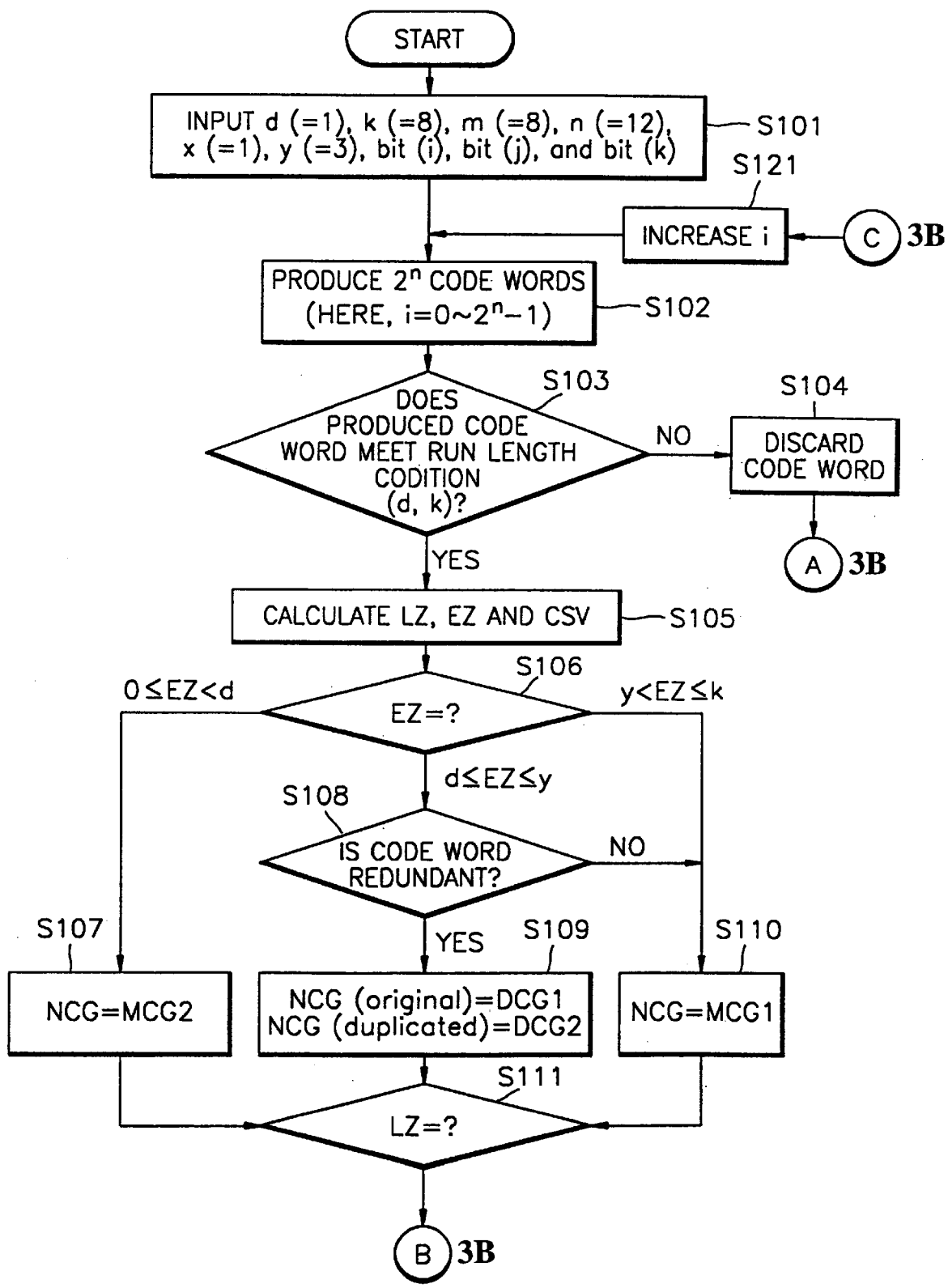

FIG. 4A

MAIN CODE GROUPS MCG1 AND MCG2 AND REDUNDANT CODE DEMODULATION DECISION CODE GROUPS DCG1 AND DCG2

| Data Symbol | MCG1 Code Word (MSB LSB) | NCG | MCG2 Code Word (MSB LSB) | NCG | DCG1 Code Word (MSB LSB) | NCG | DCG2 Code Word (MSB LSB) | NCG |
|---|---|---|---|---|---|---|---|---|
| 000 | 101010000000 | 1 | 001010000000 | 1 | 101010000000 | 1 | 001010000000 | 1 |
| 001 | 100101000000 | 1 | 000101000000 | 1 | 100101000000 | 1 | 000101000000 | 1 |
| 002 | 100010100000 | 1 | 000010100000 | 1 | 100010100000 | 1 | 010000000010 | 3 |
| 003 | 100001010000 | 1 | 000001010000 | 1 | 100001010000 | 1 | 010000000010 | 4 |
| 004 | 100000101000 | 3 | 000000101000 | 3 | 100000101000 | 3 | 010000001000 | 3 |
| 005 | 100000101000 | 4 | 000000101000 | 4 | 100000101000 | 4 | 010000010001 | 2 |
| 006 | 100000010100 | 3 | 000000010100 | 3 | 100000010100 | 3 | 010000010010 | 3 |
| 007 | 100000010100 | 4 | 000000010100 | 4 | 100000010100 | 4 | 010000010010 | 4 |
| 008 | 100000001010 | 1 | 001001000000 | 1 | 100000001010 | 3 | 001001000000 | 1 |
| 009 | 100000000101 | 2 | 000100100000 | 1 | 100000000101 | 2 | 000100100000 | 1 |
| 010 | 010101000000 | 1 | 000010010000 | 1 | 100001001000 | 3 | 010010000000 | 1 |
| 011 | 010010100000 | 1 | 000001001000 | 3 | 100001001000 | 4 | 010010100000 | 1 |
| 012 | 010001010000 | 1 | 000001001000 | 4 | 100100100000 | 1 | 010000101000 | 1 |
| 013 | 010000101000 | 3 | 000000100100 | 3 | 100000001010 | 4 | 010000101000 | 3 |
| 014 | 010000101000 | 4 | 000000100100 | 4 | 100010100001 | 2 | 010000101000 | 4 |
| 015 | 010000010100 | 3 | 000000010010 | 3 | 100001010001 | 2 | 010000010100 | 3 |
| 016 | 010000010100 | 4 | 000000010010 | 4 | 100000101010 | 3 | 010000010100 | 4 |
| 017 | 010000001010 | 3 | 010100010100 | 3 | 100101000001 | 2 | 010000001010 | 3 |
| 018 | 010000001010 | 4 | 010100010100 | 4 | 100001010010 | 3 | 010000001010 | 4 |
| 019 | 010000000101 | 2 | 010100001010 | 3 | 100001010010 | 3 | 010000000101 | 2 |
| 020 | 010000000010 | 3 | 001010000001 | 2 | 100000101001 | 2 | 001010000001 | 2 |
| 021 | 010000000010 | 4 | 000101000001 | 2 | 100010001010 | 3 | 000101000001 | 2 |
| 022 | 010010100000 | 1 | 010010100000 | 1 | 100010010010 | 3 | 001010100000 | 1 |
| 023 | 010100000001 | 2 | 001000000001 | 2 | 100010100010 | 3 | 001000000001 | 2 |
| 024 | 101010000001 | 2 | 000010100001 | 2 | 101010000001 | 2 | 010000100010 | 3 |
| 025 | 101010000000 | 1 | 010100010010 | 4 | 100000010101 | 2 | 010100001010 | 3 |
| 026 | 101000000001 | 2 | 001000000010 | 3 | 101000000001 | 2 | 001000000010 | 3 |
| 027 | 100101000001 | 2 | 000001010001 | 2 | 100001000010 | 3 | 010000100010 | 4 |
| 028 | 100100100000 | 1 | 010100000101 | 2 | 000010010000 | 1 | 010100000101 | 2 |
| 029 | 100010100001 | 2 | 000000010101 | 2 | 100000010101 | 3 | 010000100100 | 3 |
| 030 | 100010010000 | 1 | 010001000000 | 1 | 100010010000 | 1 | 010001000000 | 1 |
| 031 | 100001010001 | 2 | 000000010101 | 2 | 100000100010 | 3 | 010000100100 | 4 |
| 032 | 100001001000 | 3 | 001010101000 | 3 | 000001001000 | 3 | 001010101000 | 3 |
| 033 | 100001001000 | 4 | 001010101000 | 4 | 000001001000 | 4 | 001010101000 | 4 |
| 034 | 100000101001 | 2 | 010010000001 | 2 | 100010000010 | 3 | 010010000001 | 2 |
| 035 | 100000100100 | 3 | 001010010100 | 3 | 100000100100 | 3 | 001010010100 | 3 |
| 036 | 100000100100 | 4 | 001010010100 | 4 | 100000100100 | 4 | 001010010100 | 4 |
| 037 | 100000010101 | 2 | 001010000010 | 3 | 101001000000 | 1 | 001010000010 | 3 |
| 038 | 100000010010 | 1 | 001010001010 | 3 | 100000010010 | 4 | 001010001010 | 3 |
| 039 | 100000001001 | 2 | 001010001010 | 4 | 100000001001 | 2 | 001010001010 | 4 |
| 040 | 100000000100 | 3 | 001010000010 | 4 | 100000000100 | 3 | 010010000010 | 4 |
| 041 | 100000000100 | 4 | 001001000001 | 2 | 100000000100 | 4 | 001001000001 | 2 |
| 042 | 010101000001 | 2 | 000101000010 | 3 | 100010101010 | 3 | 000101000010 | 3 |
| 043 | 010100100000 | 1 | 001010000101 | 2 | 100100000010 | 3 | 001010000101 | 2 |
| 044 | 010100100001 | 2 | 000101001010 | 4 | 100100000010 | 3 | 000101000010 | 4 |
| 045 | 010010010000 | 1 | 001000100000 | 1 | 100100010010 | 3 | 001000100000 | 1 |
| 046 | 010001010001 | 2 | 000100100001 | 2 | 100100100010 | 3 | 000100100001 | 2 |
| 047 | 010001001000 | 3 | 000101010100 | 3 | 100100101010 | 3 | 000101010100 | 3 |
| 048 | 010001001000 | 4 | 000101010100 | 4 | 100101000010 | 3 | 000101010100 | 4 |
| 049 | 010000101001 | 2 | 000010100010 | 3 | 000010100010 | 3 | 010000101001 | 2 |
| 050 | 010000100100 | 3 | 000101001010 | 3 | 100101001010 | 3 | 000101001010 | 3 |
| 051 | 010000100100 | 4 | 000101001010 | 4 | 100101010010 | 3 | 000101001010 | 4 |
| 052 | 010000010101 | 2 | 000010100010 | 4 | 000010100010 | 4 | 010000010101 | 2 |
| 053 | 010000010010 | 3 | 000101000101 | 2 | 000001000000 | 1 | 000101000101 | 2 |
| 054 | 010000010010 | 4 | 000100010000 | 1 | 000001000001 | 2 | 000100010000 | 1 |
| 055 | 010000001001 | 2 | 000010101010 | 3 | 000010101010 | 3 | 010000001001 | 2 |
| 056 | 010000000100 | 3 | 000010010001 | 2 | 000010010001 | 2 | 010000000100 | 3 |
| 057 | 010000000100 | 4 | 000001010010 | 3 | 000001010010 | 3 | 010000000100 | 4 |
| 058 | 010100010100 | 3 | 001000000010 | 4 | 000000100010 | 3 | 001000000010 | 4 |
| 059 | 010100000010 | 4 | 000100000001 | 2 | 000001000010 | 4 | 000100000001 | 2 |
| 060 | 010100101000 | 3 | 001001010000 | 1 | 000001000100 | 3 | 001001010000 | 1 |

FIG. 4B

MAIN CODE GROUPS MCG1 AND MCG2 AND REDUNDANT CODE DEMODULATION DECISION CODE GROUPS DCG1 AND DCG2

| Data Symbol | MCG1 Code Word (MSB LSB) | NCG | MCG2 Code Word (MSB LSB) | NCG | DCG1 Code Word (MSB LSB) | NCG | DCG2 Code Word (MSB LSB) | NCG |
|---|---|---|---|---|---|---|---|---|
| 061 | 010100101000 | 4 | 001000101000 | 3 | 000001000100 | 4 | 001000101000 | 3 |
| 062 | 010101010000 | 1 | 001000101000 | 4 | 000001000101 | 2 | 001000101000 | 4 |
| 063 | 101010101000 | 3 | 000010101010 | 4 | 101010101000 | 3 | 010000100101 | 2 |
| 064 | 101010101000 | 4 | 000010100101 | 2 | 101010101000 | 4 | 010000101010 | 3 |
| 065 | 101010100000 | 1 | 001000010100 | 3 | 101010100000 | 1 | 001000010100 | 3 |
| 066 | 101010010100 | 3 | 000010001000 | 3 | 101010010100 | 3 | 010000101010 | 4 |
| 067 | 101010010100 | 4 | 000010001000 | 4 | 101010010100 | 4 | 010000100100 | 3 |
| 068 | 101010001010 | 3 | 000001010101 | 2 | 101010001010 | 3 | 010001000100 | 4 |
| 069 | 101010001010 | 4 | 000001000100 | 3 | 101010001010 | 4 | 010001001000 | 3 |
| 070 | 101010000101 | 2 | 000001000100 | 4 | 101010000101 | 2 | 010001001000 | 4 |
| 071 | 101010000010 | 3 | 000001010010 | 4 | 101010000010 | 3 | 010001001001 | 2 |
| 072 | 101010000010 | 4 | 000001001001 | 2 | 101010000010 | 4 | 010001010001 | 2 |
| 073 | 101001010000 | 1 | 001000010100 | 4 | 101001010000 | 1 | 001000010100 | 4 |
| 074 | 101001000001 | 2 | 000000101010 | 3 | 101001000001 | 2 | 010001010010 | 3 |
| 075 | 101000101000 | 3 | 001000101010 | 3 | 101000101000 | 3 | 001000001010 | 3 |
| 076 | 101000101000 | 4 | 001000001010 | 4 | 101000101000 | 4 | 001000001010 | 4 |
| 077 | 101000100000 | 1 | 000000100010 | 3 | 101000100000 | 1 | 010001010010 | 4 |
| 078 | 101000010100 | 3 | 001000000101 | 2 | 101000010100 | 3 | 001000000101 | 2 |
| 079 | 101000010100 | 4 | 000010000000 | 1 | 101000010100 | 4 | 010001010101 | 2 |
| 080 | 101000001010 | 3 | 001010010000 | 1 | 101000001010 | 3 | 001010010000 | 1 |
| 081 | 101000001010 | 4 | 001001001000 | 3 | 101000001010 | 4 | 001001001000 | 3 |
| 082 | 101000000101 | 2 | 001001001000 | 4 | 101000000101 | 2 | 001001001000 | 4 |
| 083 | 101000000010 | 3 | 001010100001 | 2 | 101000000010 | 3 | 001010100001 | 2 |
| 084 | 101000000010 | 4 | 001001010001 | 2 | 101000000010 | 4 | 001010010001 | 2 |
| 085 | 100101010100 | 3 | 000000100010 | 4 | 100101010100 | 3 | 010010000000 | 1 |
| 086 | 100101010100 | 4 | 000000010001 | 2 | 100101010100 | 4 | 010010001000 | 3 |
| 087 | 100101001010 | 1 | 010101001000 | 3 | 100101001010 | 4 | 010101001000 | 3 |
| 088 | 100101010101 | 2 | 010101001000 | 4 | 100101010101 | 2 | 010101001000 | 4 |
| 089 | 100101000010 | 1 | 000000101010 | 4 | 100101000010 | 4 | 010010001000 | 4 |
| 090 | 100100100001 | 2 | 000000100101 | 2 | 100100100001 | 2 | 010010010000 | 1 |
| 091 | 100100010000 | 1 | 010100100100 | 3 | 100100010000 | 1 | 010100100100 | 3 |
| 092 | 100100000001 | 2 | 001000000101 | 2 | 100100000001 | 2 | 001000101001 | 2 |
| 093 | 100010101010 | 1 | 010100101100 | 4 | 100010101010 | 4 | 010100100100 | 4 |
| 094 | 100010100101 | 2 | 010100010010 | 3 | 100010100101 | 2 | 010100010010 | 3 |
| 095 | 100010100010 | 1 | 010101010001 | 2 | 100010100010 | 4 | 010101010001 | 2 |
| 096 | 100010010001 | 2 | 010100101001 | 2 | 100010010001 | 2 | 010100101001 | 2 |
| 097 | 100010001000 | 3 | 010100010010 | 4 | 100010001000 | 3 | 010100010010 | 4 |
| 098 | 100010001000 | 4 | 010100001001 | 2 | 100010001000 | 4 | 010100001001 | 2 |
| 099 | 100010000000 | 1 | 001000100100 | 3 | 100010000000 | 1 | 001000100100 | 3 |
| 100 | 100001010101 | 2 | 010100101001 | 3 | 100001010101 | 2 | 010010101000 | 3 |
| 101 | 100001010010 | 1 | 010100101101 | 2 | 100001010010 | 4 | 010100101101 | 2 |
| 102 | 100001001001 | 2 | 010100000100 | 3 | 100001001001 | 2 | 010100000100 | 3 |
| 103 | 100001000100 | 3 | 010010101000 | 4 | 100001000100 | 3 | 010010101000 | 4 |
| 104 | 100001000100 | 4 | 010010010100 | 3 | 100001000100 | 4 | 010010010100 | 3 |
| 105 | 100000101010 | 1 | 010100100100 | 4 | 100000101010 | 4 | 010100000100 | 4 |
| 106 | 100000100101 | 2 | 010010000010 | 3 | 100000100101 | 2 | 010010000010 | 3 |
| 107 | 100000100010 | 1 | 010010010100 | 4 | 100000100010 | 4 | 010010010100 | 4 |
| 108 | 100000010001 | 2 | 010010001010 | 3 | 100000010001 | 2 | 010010001010 | 3 |
| 109 | 100000001000 | 3 | 010010010000 | 4 | 100000001000 | 3 | 010010000010 | 4 |
| 110 | 100000001000 | 4 | 010001000001 | 2 | 100000001000 | 4 | 010001000001 | 2 |
| 111 | 010100100001 | 2 | 001010101001 | 2 | 000001001001 | 2 | 001010101001 | 2 |
| 112 | 010101000101 | 2 | 010010001010 | 4 | 000001001010 | 3 | 010010001010 | 4 |
| 113 | 010100010000 | 1 | 010010000101 | 2 | 000001001010 | 4 | 010010000101 | 2 |
| 114 | 010010100010 | 3 | 001010010101 | 2 | 000001010010 | 1 | 001010010101 | 2 |
| 115 | 010010100010 | 4 | 001010100100 | 3 | 000001010001 | 2 | 001010100100 | 3 |
| 116 | 010010100101 | 2 | 010000100000 | 1 | 000001010010 | 4 | 010000100000 | 1 |
| 117 | 010010010001 | 2 | 001010000100 | 4 | 000001010100 | 3 | 001010000100 | 4 |
| 118 | 010010001000 | 3 | 001010100100 | 3 | 000001010100 | 4 | 001010100100 | 3 |
| 119 | 010010001000 | 4 | 001010100100 | 4 | 000001010101 | 2 | 001010100100 | 4 |
| 120 | 010001010101 | 2 | 001010010010 | 3 | 000010000000 | 1 | 001010010010 | 3 |

FIG. 4C

MAIN CODE GROUPS MCG1 AND MCG2 AND REDUNDANT CODE DEMODULATION DECISION CODE GROUPS DCG1 AND DCG2

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 121 | 010001010010 | 3 | 001001000010 | 3 | 000010000001 | 2 | 001001000010 | 3 |
| 122 | 010001010010 | 4 | 001001000010 | 4 | 000010000010 | 3 | 001001000010 | 4 |
| 123 | 010001001001 | 2 | 001000100001 | 2 | 000010000010 | 4 | 001000100001 | 2 |
| 124 | 010001000100 | 3 | 001010010010 | 4 | 000010000100 | 3 | 001010010010 | 4 |
| 125 | 010001000100 | 4 | 001010001001 | 2 | 000010000100 | 4 | 001010001001 | 2 |
| 126 | 010000010001 | 2 | 001001010100 | 3 | 000010000101 | 2 | 001001010100 | 3 |
| 127 | 010101010100 | 3 | 001001010100 | 4 | 000010001000 | 3 | 001001010100 | 4 |
| 128 | 010101010100 | 4 | 001001001010 | 3 | 000010001000 | 4 | 001001001010 | 3 |
| 129 | 010101000010 | 3 | 000101010101 | 2 | 000010001001 | 2 | 000101010101 | 2 |
| 130 | 010101000010 | 4 | 000101000100 | 3 | 000010001010 | 3 | 000101000100 | 3 |
| 131 | 010010101010 | 3 | 001001001010 | 4 | 000010001010 | 4 | 001001001010 | 4 |
| 132 | 010010101010 | 4 | 001001000101 | 2 | 000010010010 | 3 | 001001000101 | 2 |
| 133 | 010101001010 | 3 | 001000010000 | 1 | 000010010010 | 4 | 001000010000 | 1 |
| 134 | 010101001010 | 4 | 000101010010 | 3 | 000010010100 | 3 | 000101010010 | 3 |
| 135 | 010000101010 | 3 | 000101000100 | 4 | 000010010100 | 4 | 000101000100 | 4 |
| 136 | 010000101010 | 4 | 000100100010 | 3 | 000010010101 | 2 | 000100100010 | 3 |
| 137 | 010000100101 | 2 | 000100100010 | 4 | 000010100000 | 1 | 000100100010 | 4 |
| 138 | 010000100010 | 3 | 000101010010 | 4 | 000010100001 | 2 | 000101010010 | 4 |
| 139 | 010000100010 | 4 | 000101001001 | 2 | 000010100100 | 3 | 000101001001 | 2 |
| 140 | 010000001000 | 3 | 000100010001 | 2 | 000010100101 | 2 | 000100010001 | 2 |
| 141 | 010000001000 | 4 | 000010100100 | 3 | 000010100100 | 4 | 010000001000 | 4 |
| 142 | 101010101001 | 2 | 000010101000 | 4 | 101010101001 | 2 | 010010010001 | 2 |
| 143 | 101010100100 | 3 | 000100101010 | 3 | 101010100100 | 3 | 000100101010 | 3 |
| 144 | 101010100100 | 4 | 000100101010 | 4 | 101010100100 | 4 | 000100101010 | 4 |
| 145 | 101010100001 | 2 | 001000010101 | 2 | 101010100001 | 2 | 001000010101 | 2 |
| 146 | 101010010101 | 2 | 000010010010 | 3 | 101010101010 | 2 | 010010100001 | 2 |
| 147 | 101010010010 | 3 | 000100100101 | 2 | 101010010010 | 3 | 000100100101 | 2 |
| 148 | 101010010010 | 4 | 000100001000 | 3 | 101010010010 | 4 | 000100001000 | 3 |
| 149 | 101010010000 | 1 | 001000100100 | 4 | 101010010000 | 1 | 001000100100 | 4 |
| 150 | 101010001001 | 2 | 000100001001 | 4 | 101010001001 | 2 | 000100001000 | 4 |
| 151 | 101010000100 | 3 | 000010010010 | 4 | 101010000100 | 3 | 010010100010 | 3 |
| 152 | 101010000100 | 4 | 000010001001 | 2 | 101010000100 | 4 | 010010100010 | 4 |
| 153 | 101001010100 | 3 | 000010101001 | 2 | 101001010100 | 3 | 010010100101 | 2 |
| 154 | 101001010100 | 4 | 000010010101 | 2 | 101001010100 | 4 | 010010101010 | 3 |
| 155 | 101001010001 | 2 | 001000000100 | 3 | 101001010001 | 2 | 001010000100 | 3 |
| 156 | 101001001010 | 3 | 000010000100 | 3 | 101001001010 | 3 | 010010101010 | 4 |
| 157 | 101001001010 | 4 | 000010000100 | 4 | 101001001010 | 4 | 010100000001 | 2 |
| 158 | 101001001000 | 3 | 001000010010 | 3 | 101001001000 | 3 | 001000010010 | 3 |
| 159 | 101001001000 | 4 | 001000010010 | 4 | 101001001000 | 4 | 001000010010 | 4 |
| 160 | 101001000101 | 2 | 000001000010 | 3 | 101001000101 | 2 | 010100000010 | 3 |
| 161 | 101001000010 | 3 | 000001010100 | 3 | 101001000010 | 3 | 010100000010 | 4 |
| 162 | 101001000010 | 4 | 000001010100 | 4 | 101001000010 | 4 | 010100001010 | 4 |
| 163 | 101000101001 | 2 | 001000000100 | 4 | 101000101001 | 2 | 001000000100 | 4 |
| 164 | 101000100100 | 3 | 001000001001 | 2 | 101000100100 | 3 | 001000001001 | 2 |
| 165 | 101000100100 | 4 | 000101010000 | 1 | 101000100100 | 4 | 000101010000 | 1 |
| 166 | 101000100001 | 2 | 000001001010 | 3 | 101000100001 | 2 | 010100010000 | 1 |
| 167 | 101000010101 | 2 | 000100000010 | 3 | 101000010101 | 2 | 000100000010 | 3 |
| 168 | 101000010010 | 3 | 000100101000 | 3 | 101000010010 | 3 | 000100101000 | 3 |
| 169 | 101000010010 | 4 | 000100101000 | 4 | 101000010010 | 4 | 000100101000 | 4 |
| 170 | 101000010000 | 1 | 000001000010 | 4 | 101000010000 | 1 | 010100010100 | 3 |
| 171 | 101000001001 | 2 | 000100010100 | 3 | 101000001001 | 2 | 000100010100 | 3 |
| 172 | 101000000100 | 3 | 000100000010 | 4 | 101000000100 | 3 | 000100000010 | 4 |
| 173 | 101000000100 | 4 | 000010000010 | 2 | 101000000100 | 4 | 010100010100 | 4 |
| 174 | 100101010101 | 2 | 000001001010 | 4 | 100101010101 | 2 | 010100100000 | 1 |
| 175 | 100101010010 | 1 | 000000100001 | 2 | 100101010010 | 4 | 010100100001 | 2 |
| 176 | 100101010000 | 1 | 000100010100 | 4 | 100101010000 | 1 | 000100010100 | 4 |
| 177 | 100101001001 | 2 | 010101010101 | 2 | 100101001001 | 2 | 010100101000 | 3 |
| 178 | 100101000100 | 3 | 000000001001 | 2 | 100101000100 | 3 | 010100101000 | 4 |
| 179 | 100101000100 | 4 | 000000010000 | 1 | 100101000100 | 4 | 010100101010 | 3 |
| 180 | 100100101010 | 1 | 010100100010 | 3 | 100100101010 | 4 | 010100100010 | 3 |

FIG. 4D

MAIN CODE GROUPS MCG1 AND MCG2 AND
REDUNDANT CODE DEMODULATION DECISION
CODE GROUPS DCG1 AND DCG2

| Data Symbol | MCG1 Code Word (MSB LSB) | NCG | MCG2 Code Word (MSB LSB) | NCG | DCG1 Code Word (MSB LSB) | NCG | DCG2 Code Word (MSB LSB) | NCG |
|---|---|---|---|---|---|---|---|---|
| 181 | 100100101000 | 3 | 000100001010 | 3 | 100100101000 | 3 | 000100001010 | 3 |
| 182 | 100100101000 | 4 | 000100001010 | 4 | 100100101000 | 4 | 000100001010 | 4 |
| 183 | 100100100101 | 2 | 010100100010 | 4 | 100100100101 | 2 | 010100100010 | 4 |
| 184 | 100100100010 | 1 | 010101010010 | 3 | 100100100010 | 4 | 010101010010 | 3 |
| 185 | 100100010100 | 3 | 000100000101 | 2 | 100100010100 | 3 | 000100000101 | 2 |
| 186 | 100100010100 | 4 | 000001000000 | 1 | 100100010100 | 4 | 010100101010 | 4 |
| 187 | 100100010001 | 2 | 010101010010 | 4 | 100100010001 | 2 | 010101010010 | 4 |
| 188 | 100100001010 | 1 | 010101001001 | 2 | 100100001010 | 4 | 010101001001 | 2 |
| 189 | 100100001000 | 3 | 010100010001 | 2 | 100100001000 | 3 | 010100010001 | 2 |
| 190 | 100100001000 | 4 | 010010100100 | 3 | 100100001000 | 4 | 010010100100 | 3 |
| 191 | 100100000101 | 2 | 010100100101 | 2 | 100100000101 | 2 | 010100100101 | 2 |
| 192 | 100100000010 | 1 | 010010100100 | 4 | 100100000010 | 4 | 010010100100 | 4 |
| 193 | 100010101001 | 2 | 010010010010 | 3 | 100010101001 | 2 | 010010010010 | 3 |
| 194 | 100010100100 | 3 | 010100001000 | 3 | 100010100100 | 3 | 010100001000 | 3 |
| 195 | 100010100100 | 4 | 010100001000 | 4 | 100010100100 | 4 | 010100001000 | 4 |
| 196 | 100010010101 | 2 | 010010010010 | 4 | 100010010101 | 2 | 010010010010 | 4 |
| 197 | 100010010010 | 1 | 010010101001 | 2 | 100010010010 | 4 | 010010101001 | 2 |
| 198 | 100010001001 | 2 | 010010010101 | 2 | 100010001001 | 2 | 010010010101 | 2 |
| 199 | 100010000100 | 3 | 010010001001 | 2 | 100010000100 | 3 | 010010001001 | 2 |
| 200 | 100010000100 | 4 | 010001010100 | 3 | 100010000100 | 4 | 010001010100 | 3 |
| 201 | 100010000001 | 2 | 010001010100 | 4 | 100010000001 | 2 | 010001010100 | 4 |
| 202 | 100001010100 | 3 | 010010000100 | 3 | 100001010100 | 3 | 010010000100 | 3 |
| 203 | 100001010100 | 4 | 010010100100 | 4 | 100001010100 | 4 | 010010100100 | 4 |
| 204 | 100001001010 | 1 | 010001000010 | 3 | 100001001010 | 4 | 010001000010 | 3 |
| 205 | 100001000101 | 2 | 010001000010 | 4 | 100001000101 | 2 | 010001000010 | 4 |
| 206 | 100001000010 | 1 | 010001001010 | 3 | 100001000010 | 4 | 010001001010 | 3 |
| 207 | 100001000000 | 1 | 010000100001 | 2 | 100001000000 | 1 | 010000100001 | 2 |
| 208 | 100000100001 | 2 | 010001001010 | 4 | 100000100001 | 2 | 010001001010 | 4 |
| 209 | 100000010000 | 1 | 001010101010 | 3 | 100000010000 | 1 | 001010101010 | 3 |
| 210 | 010101000100 | 3 | 001010101010 | 4 | 000010101000 | 3 | 001010101010 | 4 |
| 211 | 010101000100 | 4 | 001010100101 | 2 | 000010101001 | 4 | 001010100101 | 2 |
| 212 | 010100101010 | 3 | 010001000101 | 2 | 000010101001 | 2 | 010001000101 | 2 |
| 213 | 010100101010 | 4 | 010000010000 | 1 | 000010101010 | 4 | 010000010000 | 1 |
| 214 | 101010101010 | 3 | 001010001000 | 3 | 101010101010 | 3 | 001010001000 | 3 |
| 215 | 101010101010 | 4 | 001010001000 | 4 | 101010101010 | 4 | 001010001000 | 4 |
| 216 | 101010100101 | 2 | 001001010101 | 2 | 101010100101 | 2 | 001001010101 | 2 |
| 217 | 101010100010 | 3 | 001010100010 | 3 | 101010100010 | 3 | 001010100010 | 3 |
| 218 | 101010100010 | 4 | 001010100010 | 4 | 101010100010 | 4 | 001010100010 | 4 |
| 219 | 101010010001 | 2 | 001010010001 | 2 | 101010010001 | 2 | 001010010001 | 2 |
| 220 | 101010001000 | 3 | 001001000100 | 3 | 101010001000 | 3 | 001001000100 | 3 |
| 221 | 101010001000 | 4 | 001001000100 | 4 | 101010001000 | 4 | 001001000100 | 4 |
| 222 | 101001010101 | 2 | 001000100010 | 3 | 101001010101 | 2 | 001000100010 | 3 |
| 223 | 101001010010 | 3 | 001001010010 | 3 | 101001010010 | 3 | 001001010010 | 3 |
| 224 | 101001010010 | 4 | 001001010010 | 4 | 101001010010 | 4 | 001001010010 | 4 |
| 225 | 101001001001 | 2 | 001001001001 | 2 | 101001001001 | 2 | 001001001001 | 2 |
| 226 | 101001000100 | 3 | 001000100010 | 4 | 101001000100 | 3 | 001000100010 | 4 |
| 227 | 101001000100 | 4 | 001000010001 | 2 | 101001000100 | 4 | 001000010001 | 2 |
| 228 | 101000101010 | 3 | 001000101010 | 3 | 101000101010 | 3 | 001000101010 | 3 |
| 229 | 101000101010 | 4 | 001000101010 | 4 | 101000101010 | 4 | 001000101010 | 4 |
| 230 | 101000100101 | 2 | 001000100101 | 2 | 101000100101 | 2 | 001000100101 | 2 |
| 231 | 101000100010 | 3 | 000101001000 | 3 | 101000100010 | 3 | 000101001000 | 3 |
| 232 | 101000100010 | 4 | 000101001000 | 4 | 101000100010 | 4 | 000101001000 | 4 |
| 233 | 101000010001 | 2 | 000100100100 | 3 | 101000010001 | 2 | 000100100100 | 3 |
| 234 | 101000001000 | 3 | 001000001000 | 3 | 101000001000 | 3 | 001000001000 | 3 |
| 235 | 101000001000 | 4 | 001000001000 | 4 | 101000001000 | 4 | 001000001000 | 4 |
| 236 | 100101010001 | 2 | 000101010001 | 2 | 100101010001 | 2 | 000101010001 | 2 |
| 237 | 100101001000 | 3 | 000100100100 | 4 | 100101001000 | 3 | 000100100100 | 4 |
| 238 | 100101001000 | 4 | 000100010010 | 3 | 100101001000 | 4 | 000100010010 | 3 |
| 239 | 100100101001 | 2 | 000100101001 | 2 | 100100101001 | 2 | 000100101001 | 2 |
| 240 | 100100100100 | 3 | 000100010010 | 4 | 100100100100 | 3 | 000100010010 | 4 |

FIG. 4E

MAIN CODE GROUPS MCG1 AND MCG2 AND REDUNDANT CODE DEMODULATION DECISION CODE GROUPS DCG1 AND DCG2

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 241 | 100100100100 | 4 | 000100001001 | 2 | 100100100100 | 4 | 000100001001 | 2 |
| 242 | 100100010101 | 2 | 000100010101 | 2 | 100100010101 | 2 | 000100010101 | 2 |
| 243 | 100100010010 | 1 | 000010101000 | 3 | 100100010010 | 4 | 010101000001 | 2 |
| 244 | 100100001001 | 2 | 000010101000 | 4 | 100100001001 | 2 | 010101000010 | 3 |
| 245 | 100100000100 | 3 | 000100000100 | 3 | 100100000100 | 3 | 000100000100 | 3 |
| 246 | 100100000100 | 4 | 000100000100 | 4 | 100100000100 | 4 | 000100000100 | 4 |
| 247 | 100010101000 | 3 | 000010010100 | 3 | 100010101000 | 3 | 010101000010 | 4 |
| 248 | 100010101000 | 4 | 000010010100 | 4 | 100010101000 | 4 | 010101000100 | 3 |
| 249 | 100010010100 | 3 | 000010001010 | 3 | 100010010100 | 3 | 010101000100 | 4 |
| 250 | 100010010100 | 4 | 000010001010 | 4 | 100010010100 | 4 | 010101000101 | 2 |
| 251 | 100010001010 | 1 | 000010000101 | 2 | 100010001010 | 4 | 010101001010 | 3 |
| 252 | 100010000101 | 2 | 000000100000 | 1 | 100010000101 | 2 | 010101001010 | 4 |
| 253 | 100010000010 | 1 | 000010000010 | 3 | 100010000010 | 4 | 010101010000 | 1 |
| 254 | 100001000001 | 2 | 000010000010 | 4 | 100001000001 | 2 | 010101010100 | 3 |
| 255 | 100000100000 | 1 | 000001000001 | 2 | 100000100000 | 1 | 010101010100 | 4 |

FIG. 5

FIRST DSV CODE GROUP FOR CONTROLLING DC SUPPRESSION WITH THE AID OF MAIN CODE GROUP MCG2

| Data Symbol | DSV Code Group 1 Code Word (MSB - LSB) | NCG | Data Symbol | DSV Code Group 1 Code Word (MSB - LSB) | NCG |
|---|---|---|---|---|---|
| 000 | 010000000101 | 3 | 051 | 010000010001 | 3 |
| 001 | 010000000101 | 4 | 052 | 010000001000 | 3 |
| 002 | 010000001010 | 3 | 053 | 010000010001 | 4 |
| 003 | 010000001010 | 4 | 054 | 010001000100 | 3 |
| 004 | 010000010100 | 3 | 055 | 010001000100 | 4 |
| 005 | 010000010100 | 4 | 056 | 010000001000 | 4 |
| 006 | 010000101000 | 3 | 057 | 010000100101 | 3 |
| 007 | 010000101000 | 4 | 058 | 010100000010 | 3 |
| 008 | 010001010000 | 3 | 059 | 010100000010 | 4 |
| 009 | 010001010000 | 4 | 060 | 000000001010 | 4 |
| 010 | 010010100000 | 3 | 061 | 010010000000 | 3 |
| 011 | 010010100000 | 4 | 062 | 000000001001 | 3 |
| 012 | 010101000000 | 3 | 063 | 010001010101 | 3 |
| 013 | 010101000000 | 4 | 064 | 010001010101 | 4 |
| 014 | 010000001001 | 3 | 065 | 010010000000 | 4 |
| 015 | 010000001001 | 4 | 066 | 010010001000 | 3 |
| 016 | 010000010010 | 3 | 067 | 010010001000 | 4 |
| 017 | 010000010010 | 4 | 068 | 010010100101 | 3 |
| 018 | 010000100100 | 3 | 069 | 010010100101 | 4 |
| 019 | 010000100100 | 4 | 070 | 010100010000 | 3 |
| 020 | 010000000010 | 3 | 071 | 010000100101 | 4 |
| 021 | 010000000010 | 4 | 072 | 010000101010 | 3 |
| 022 | 000000001010 | 3 | 073 | 000000001001 | 4 |
| 023 | 010100000001 | 3 | 074 | 010000101010 | 4 |
| 024 | 010000000100 | 3 | 075 | 010101010000 | 3 |
| 025 | 010001001000 | 3 | 076 | 010101010000 | 4 |
| 026 | 010100000001 | 4 | 077 | 010100010000 | 4 |
| 027 | 010000000100 | 4 | 078 | 010100101000 | 3 |
| 028 | 010001001000 | 4 | 079 | 010100101000 | 4 |
| 029 | 010000010101 | 3 | 080 | 010101000100 | 3 |
| 030 | 010010010000 | 3 | 081 | 010101000100 | 4 |
| 031 | 010000010101 | 4 | 082 | 000000001000 | 3 |
| 032 | 010100100000 | 3 | 083 | 000000001000 | 4 |
| 033 | 010010010000 | 4 | 084 | -010100101010 | 3 |
| 034 | 010000101001 | 3 | 085 | 010101000101 | 3 |
| 035 | 010100100000 | 4 | 086 | 010101000101 | 4 |
| 036 | 010000100010 | 3 | 087 | 010100101010 | 4 |
| 037 | 010000101001 | 4 | 088 | 010101000010 | 3 |
| 038 | 010000100010 | 4 | 089 | 010101000010 | 4 |
| 039 | 010101001010 | 3 | 090 | 010001001001 | 3 |
| 040 | 010001010001 | 3 | 091 | 010001001001 | 4 |
| 041 | 010010100001 | 3 | 092 | 010001010010 | 3 |
| 042 | 010001010001 | 4 | 093 | 010001010010 | 4 |
| 043 | 010101001010 | 4 | 094 | 010010010001 | 3 |
| 044 | 010010100001 | 4 | 095 | 010010010001 | 4 |
| 045 | 010010101010 | 3 | 096 | 010010100010 | 3 |
| 046 | 010101000001 | 3 | 097 | 010010100010 | 4 |
| 047 | 010010101010 | 4 | 098 | 010100100001 | 3 |
| 048 | 010101010100 | 3 | 099 | 010100000000 | 1 |
| 049 | 010101000001 | 4 | 100 | 010100100001 | 4 |
| 050 | 010101010100 | 4 | 101 | 000100000000 | 1 |

FIG. 6

SECOND DSV CODE GROUP FOR CONTROLLING
DC SUPPRESSION WITH THE AID OF REDUNDANT
CODE DEMODULATION DECISION CODE GROUP DCG1

| Data Symbol | DSV Code Group 2 Code Word MSB LSB | NCG | Data Symbol | DSV Code Group 2 Code Word MSB LSB | NCG |
|---|---|---|---|---|---|
| 000 | 000000100100 | 3 | 014 | 000000010000 | 3 |
| 001 | 000000010001 | 3 | 015 | 000000010101 | 3 |
| 002 | 000000010001 | 4 | 016 | 100100000000 | 1 |
| 003 | 000000010010 | 3 | 017 | 000000100101 | 3 |
| 004 | 000000010010 | 4 | 018 | 000000101001 | 3 |
| 005 | 000000010100 | 3 | 019 | 000000010000 | 4 |
| 006 | 000000010100 | 4 | 020 | 000000010101 | 4 |
| 007 | 000000100100 | 4 | 021 | 000000100000 | 3 |
| 008 | 000000100001 | 3 | 022 | 000000100101 | 4 |
| 009 | 000000100001 | 4 | 023 | 000000101001 | 4 |
| 010 | 000000100010 | 3 | 024 | 000000101010 | 3 |
| 011 | 000000100010 | 4 | 025 | 000000101010 | 4 |
| 012 | 000000101000 | 3 | 026 | 000000100000 | 4 |
| 013 | 000000101000 | 4 | | | |

FIG. 7

THIRD DSV CODE GROUP FOR CONTROLLING
DC SUPPRESSION WITH THE AID OF REDUNDANT
CODE DEMODULATION DECISION CODE GROUP DCG1

| Data Symbol | DSV Code Group 3 Code Word MSB LSB | NCG |
|---|---|---|
| 000 | 010101010101 | 3 |
| 001 | 010101010101 | 4 |
| 002 | 010100000000 | 1 |
| 003 | 000100000000 | 1 |

FIG. 8

| NCG | 1 | | 2 | | 3 | | 4 | |
|---|---|---|---|---|---|---|---|---|
| CODE GROUP HAVING THE NEXT CODE WORD DESIGNATED BY NCG | CONVERSION CODE GROUP | DC SUPPRESSION CODE GROUP CAPABLE OF CONTROLLING DC SUPPRESSION TOGETHER WITH MCG1 | CONVERSION CODE GROUP | DC SUPPRESSION CODE GROUP CAPABLE OF CONTROLLING DC SUPPRESSION TOGETHER WITH MCG2 | CONVERSION CODE GROUP | DC SUPPRESSION CODE GROUP CAPABLE OF CONTROLLING DC SUPPRESSION TOGETHER WITH DCG1 | CONVERSION CODE GROUP | DC SUPPRESSION CODE GROUP CAPABLE OF CONTROLLING DC SUPPRESSION TOGETHER WITH DCG2 |
| | MCG1 | MCG2 | MCG2 | FIRST DSV CODE GROUP | DCG1 | SECOND DSV CODE GROUP | DCG2 | THIRD DSV CODE GROUP |
| PROPERTIES | LZ=0~1 | LZ=1~7 | LZ=1~7 | LZ=1~8 | LZ=0,4,5 | LZ=0,6,7 | LZ=1~3 | LZ=1~3 |
| METHOD OF PRODUCING REDUNDANT CODES | DUPLICATE ALL CODE WORDS HAVING EZ OF 1 TO 3 EXCEPTING 1000xxxxx10 or 1001xxxxx10 | DUPLICATE ALL CODE WORDS HAVING EZ OF 1 TO 3 | DUPLICATE ALL CODE WORDS HAVING EZ OF 1 TO 3 | DUPLICATE ALL CODE WORDS HAVING EZ OF 0 TO 7 | DUPLICATE ALL CODE WORDS HAVING EZ OF 1 TO 3 | DUPLICATE ALL CODE WORDS HAVING EZ OF 0 TO 7 | DUPLICATE ALL CODE WORDS HAVING EZ OF 1 TO 3 | DUPLICATE ALL CODE WORDS HAVING EZ OF 0 TO 7 |

IMPROVEMENT IN DC SUPPRESSION
BY PRESENT INVENTION

—— PSD CURVE OF CODE STREAM CONVERTED BY
METHOD ACCORDING TO THE PRESENT INVENTION
---- PSD CURVE OF CODE STREAM CONVERTED BY
CONVERTED BY CONVENTIONAL METHOD

FIG. 11

| NCG[n-1] | EZ=0 | 1≤EZ≤3 | EZ>3 |
|---|---|---|---|
|  | 2 | 3 or 4 | 1 |

FIG. 12

| NCG[n-1] | EZ=0 | 1≤EZ≤3 | EZ>3 |
|---|---|---|---|
|  | 2 | 3 OR 4<br>EXCEPTIONS: NCG[n-1] OF CODE WORD 1000xxxxx10 OR 1001xxxxx10 AMONG THE CODE WORDS WITHIN MCG1 IS 1 | 1 |

FIG. 13

| NCG[n-1] | 0≤EZ≤7 | EZ=8 |
|---|---|---|
|  | 3 or 4 | 1 |

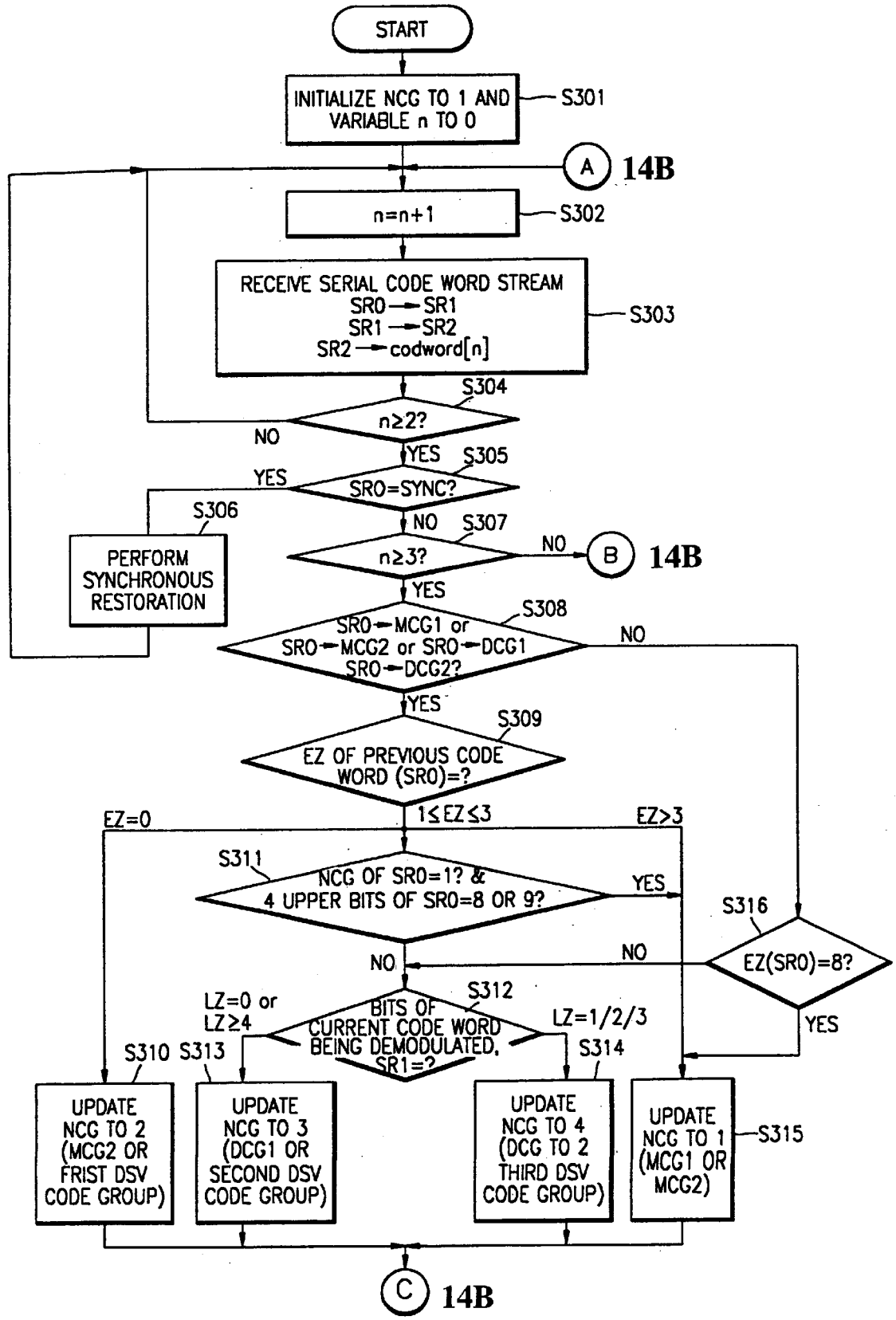

METHOD OF MODULATING AND/OR DEMODULATING RLL CODE HAVING ENHANCED DIRECT CURRENT SUPPRESSION CAPABILITY

CROSS-REFERENCE TO RELATED APPLICATIONS

This application claims the benefit of Korean Application No. 2000-52660 filed Sep. 6, 2000, in the Korean Patent Office, the disclosure of which is incorporated herein by reference

BACKGROUND OF THE INVENTION

1. Field of the Invention

The present invention relates to a method of converting an m-bit information word into a modulation signal and restoration of the modulation signal, and more particularly, to a method of modulating and demodulating by which the direct current (DC) component of a codeword stream is effectively suppressed in a run length limited (RLL) code. The method is useful in an optical recording/reproduction apparatus which requires high-density recording/reproduction.

2. Description of the Related Art

The quality of an RLL code, which is expressed as (d,k,m,n), is estimated from the recording density and the amount of suppression of its DC component, which are factors for expressing the performance of the code. Here, m denotes the number of data bits (which may also be referred to as the number of source bits or the number of information word bits), n denotes the number of bits of a modulated codeword (which may be referred to as the number of bits of a channel), d denotes the minimum number of 0s which may consecutively exist between 1 and 1 within a codeword, and k denotes the maximum number of 0s which may consecutively exist between 1 and 1 within a codeword. The interval between bits within a codeword is designated by T.

In a modulation method, the recording density can be enhanced by reducing the number (n) of bits of a codeword while fixing d and m. However, an RLL code must satisfy the minimum number (d) and maximum number (k) of 0s capable of consecutively existing between 1 and 1 within a codeword. Where the number of data bits is m while satisfying this (d,k) condition, it is preferable that the number of codewords which satisfy an RLL(d,k) condition be $2^m$ or greater. However, a portion where two codewords are connected must also satisfy the RLL(d,k) condition in order to actually use the RLL code. Where the DC component of a code affects the performance of a system, as in optical disc recording/reproduction apparatuses, a code intended to be used must have a DC suppression capability.

An important reason why a RLL-modulated code stream must suppress DC is to minimize the influence that a reproduction signal has on a servo bandwidth. Hereinafter, a DC suppressing method is referred to as a digital sum value (DSV) adjustment method.

Two DSV adjustment methods which are commonly used are a method by which a code has a DSV control code and a method of inserting a merge bit whenever a DSV is adjusted. An eight to fourteen modulation plus (EFM+) code performs DSV control using a separate code table, and an EFM code or (1,7) code performs DSV control by inserting a merge bit.

A conventional modulation code group, in which a code has a DSV control code for controlling DC suppression while satisfying the above-described condition, includes a predetermined number of main conversion code groups and DC suppression control code groups for performing DC suppression control by pairing with the main conversion code groups. In this case, the codewords within the main conversion code groups are distinguished from each other by several characteristics. That is, the main conversion code groups A and B do not share any codewords which are the same, and if a redundant code is used, there are code groups such as conversion code groups C and D for demodulating the redundant code. Here, the conversion code groups C and D for demodulating a redundant code do not share any codewords which are the same, but the codewords within the main conversion code group A or B may exist in the conversion code group C or D for demodulating a redundant code. The number of codewords in each of the main conversion code groups A and B and the redundant code demodulation conversion code groups C and D is $2^m$ if the number of bits of a non-converted source word is m.

If code groups E through H are DC suppression control code groups capable of controlling DC together with code groups A through D, the codewords within the code groups E through H have the same condition as that of the codewords within the code groups A through D which respectively form pairs with the code groups E through H. That is, in terms of a redundant codeword generation condition or a condition for the number of lead zeros, LZ, of a codeword, the same codeword generation method is applied to the DC suppression control code groups E through H and the code groups A through D that can control DC with the aid of the code groups E through H.

For example, FIG. 2 shows characteristics of an EFM+ code having a run length condition of RLL(2,10) and a codeword length (n) of 16 bits, which is used in current DVDs. There are main conversion code groups MCG1 and MCG2 (groups A and B in FIG. 1, respectively), redundant code demodulation conversion code groups DCG1 and DCG2 (groups C and D, respectively, in FIG. 1), and four DSV code groups (groups E through H in FIG. 1) capable of controlling DC suppression by forming pairs with the conversion code groups. The four conversion code groups and the four DSV code groups for DC control have no identical codewords.

Also, all of the code groups have the same condition for generating a redundant codeword, and the codewords in code group pairs capable of DC control (that is, a pair of MCG1 and a first DSV code group, a pair of MCG2 and a second DSV code group, a pair of DCG1 and a third DSV code group, and a pair of DCG2 and a fourth DSV code group) have the same characteristics.

That is, codewords in each of which the number of 0s continuing from the least significant bit (LSB) of a codeword (which is referred to as the number of end zeros) is 2 to 5 are duplicated. This rule is equally applied to all of the code groups. In each of the codewords within the first DSV code group for controlling DC suppression with the aid of the main conversion code group MCG1, the number of 0s continuing from the most significant bit (MSB) (which is referred to as the number of lead zeros) is 2 to 9. In each of the codewords within the second DSV code group for controlling DC suppression with the aid of the main conversion code group MCG2, the number of lead zeros is 0 to 1. In the codewords within the third DSV code group for controlling DC suppression with the aid of the redundant code demodulation conversion code group DCG1, some bits (here, b15 (MSB) and b3) are "0b". In the codewords within the fourth DSV code group for controlling DC suppression with the aid of the redundant code demodulation conversion code group DCG2, some bits (here, b15 (MSB) or b3) are "1b".

In a conventional modulation method using the modulation code group shown in FIGS. 1 and 2, where the number of codewords to be used to control DC suppression is insufficient, DC suppression control cannot be sufficiently accomplished due to a small number of codewords included within the code groups for controlling DC suppression.

SUMMARY OF THE INVENTION

To solve the above problem, an object of the present invention is to provide a run length limited (RLL) code modulating method which is suitable for high-density disc systems, by which the direct current (DC) component of a codeword stream is effectively suppressed.

Another object of the present invention is to provide a modulation method by which the DC component of a codeword stream is effectively suppressed using DC suppression control code groups having codewords having the same properties as the codewords in data modulation code groups which make the most of the sign of parameter CSV representing the DC value of a codeword and of characteristics of parameter INV predicting the DSV transit direction of the next codeword.

Still another object of the present invention is to provide a modulation method by which the probability of controlling DC suppression is increased by relaxing the redundant codeword generation condition and the condition of usable codewords with respect to the codewords in a DC suppression control code group which makes a pair with a data modulation code group.

Yet another object of the present invention is to provide a method of demodulating an RLL code, by which the DC component of a codeword stream is effectively suppressed.

Additional objects and advantages of the invention will be set forth in part in the description which follows, and, in part, will be obvious from the description, or may be learned by practice of the invention To achieve the above and other objects, the present invention provides a method of modulating input data into a run length limited (RLL) code which is expressed as (d,k, m,n), where d denotes a minimum run length, k denotes the maximum run length, m denotes the bit length of data, and n denotes the bit length of a codeword. In this method, m-bit input data is modulated into a codeword, which is favorable for DC suppression, from a predetermined number of first code groups for data modulation and a predetermined number of second code groups for DC suppression control, the first and second code groups having redundant codewords and being produced so that the codewords within the first code group have a first parameter CSV (codeword sum value) which represents the direct current (DC) value of a codeword, the sign of which is opposite to that of corresponding codewords within the second code group, and a second parameter INV which predicts the digital sum value (DSV) transition direction of the next codeword, the characteristic of which is opposite to that of corresponding codewords within the second code group, wherein the first and second code groups have different redundant codeword generation conditions.

To further achieve the above and other objects, the present invention provides a method of demodulating a codeword stream received by an optical recording/reproduction apparatus using a run length limited (RLL) code in which input data has been modulated into a codeword in a code group, which is favorable for DC suppression, from a predetermined number of first code groups for data modulation and a predetermined number of second code groups for DC suppression control, the first and second code groups having duplicate codewords and being produced so that the codewords within the first code group have a first parameter CSV (codeword sum value) which represents the direct current (DC) value of a codeword, the sign of which is opposite to that of corresponding codewords within the second code group, and a second parameter INV which predicts the digital sum value (DSV) transition direction of the next codeword, the characteristic of which is opposite to that of corresponding codewords within the second code group, and the first and second code groups have different duplicate codeword generation conditions. In this method, a codeword stream is received, and a third parameter NCG (next code group) designating a code group having a current codeword to be currently demodulated is updated depending on characteristics of the previous codeword. Next, a determination is made as to whether there are two identical current codewords in a code group designated by the third updated parameter NCG. Then, the current codeword is demodulated into the original data for a codeword in a code group designated by the third updated parameter NCG, if the current codeword does not have a duplicate. Also, the current codeword is demodulated into the original data for one of the two identical codewords selected depending on the LZ of the next codeword, if the current codeword has a duplicate.

BRIEF DESCRIPTION OF THE DRAWINGS

The above objective and advantage of the present invention will become more apparent by describing in detail a preferred embodiment thereof with reference to the attached drawings in which:

FIG. 1 shows an example of a configuration of a conventional modulation code group;

FIG. 2 is a table illustrating the properties of a conventional code group and the codewords included in the code group;

FIGS. 3A and 3B are flowcharts illustrating a method of producing a run length limited (RLL) code group, which is applied to the present invention;

FIGS. 4A through 4E are tables tabulating main conversion code groups MCG1 and MCG2 and redundant code demodulation conversion code groups DCG1 and DCG2 which are produced by the method shown in FIGS. 3A and 3B;

FIG. 5 is a table showing a first digital sum value (DSV) code group for controlling direct current (DC) suppression by forming a pair with a main conversion code group MCG2;

FIG. 6 is a table showing a second DSV code group for controlling DC suppression by forming a pair with a redundant code demodulation conversion code group DCG1;

FIG. 7 is a table showing a third DSV code group for controlling DC suppression by forming a pair with a redundant code demodulation conversion code group DCG2;

FIG. 8 is a table showing the properties of code groups used in the present invention and the codewords included in the code groups produced by the method shown in FIGS. 3A and 3B;

FIG. 11 is a table showing a definition of ncgdet (mc[n−1]) shown in FIG. 10B;

FIG. 12 is a table showing a definition of ncgdet* (mc[n−1]) shown in FIG. 10B;

FIG. 13 is a table showing a definition of ncgdet** (mc[n−1]) shown in FIG. 10B; and FIGS. 14A and 14B are flowcharts illustrating a demodulation method according to an embodiment of the present invention.

DESCRIPTION OF THE PREFERRED EMBODIMENT

Figure 3B:
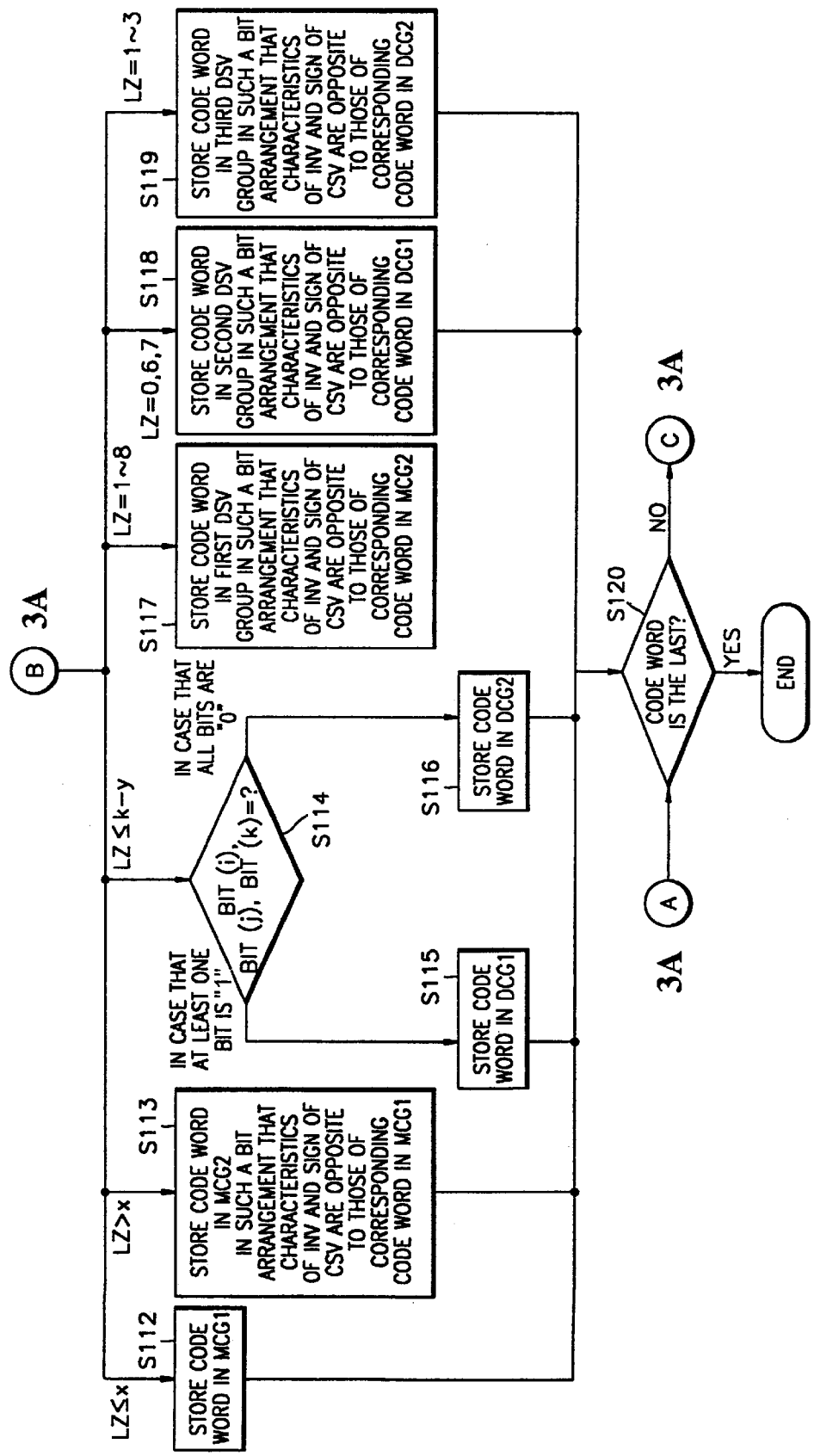

Reference will now be made in detail to the present embodiments of the present invention, examples of which are illustrated in the accompanying drawings, wherein like reference numerals refer to like elements throughout.

A method of producing run length limited (RLL) code groups, which is applied to the present invention, is shown in FIGS. 3A and 3B. A desired minimum run length d, a maximum run length k, a data bit length m, a codeword bit length n, a main conversion code group distinction parameter x, a codeword duplication parameter y, and particular bits bit(i), bit(j) and bit(k) are input, in operation 101. Here, the desired minimum run length d is 1, the maximum run length k is 8, the data bit length m is 8, the codeword bit length n is 12, the main conversion code group distinction parameter x is 1, and the codeword duplication parameter y is 3.

calculated as "+1". CSV denotes a digital sum value in a codeword. That is, a codeword is inverted every time "1" appears, and then 0 in the inverted codeword pattern is calculated as "−1" and 1 is calculated as "+1". INV is a parameter indicating a transition of the next codeword. Where an even number of 1s are included within a codeword, the value of parameter INV is 0. Where an odd number of 1s are included within a codeword, the value of parameter INV is 1. Parameter x is used to classify main conversion code groups and is referred to as a main conversion code group classification parameter. Parameter y is used to duplicate a codeword and is referred to as a codeword duplication parameter. Bit(i), bit(j) and bit(k) denote i-th, j-th and k-th bits within a codeword, respectively. Where the accumulated INV for a codeword stream is 0, the DSV is updated by adding the value CSV of the next codeword to the accumulated DSV of a codeword stream preceding the next codeword. Where the accumulated INV for a codeword stream is 1, the DSV is updated by inverting the sign of the CSV of the next codeword and adding the sign-inverted CSV of the codeword to the accumulated DSV of a codeword stream preceding the next codeword.

The following parameters INV, CSV and DSV are given for the following stream.

| Codeword: | 000010001001000 | 001001001001000 |
|---|---|---|
| INV: | 1 | 0 |
| CSV: | +1 | −3 |
| Code stream: | 000011110001111 | 110001110001111 |
| DSV: | −1−2−3−4−3−2−1 0−1−2−3−2−1 0+1 | +2+3+2+1 0+1+2+3+2+1 0+1+2+3+4 |

In step operation S102, $2^n$ codewords (here, $2^{12}$) of 0 to $2^n-1$ satisfying the conditions input in operation S101 are produced. It is determined whether the produced codewords meet the run length conditions (d,k) in operation S103. In operation S104, codewords which do not meet the run length conditions (d,k) among the produced codewords are discarded, since only the codewords satisfying the run length conditions (d,k) are used. In operation S105, parameters indicating characteristics of codewords, such as the number of lead zeros, LZ, and the number of end zeros, EZ, within each codeword and a codeword sum value (CSV), are extracted from the codewords that satisfy the run length conditions (d,k).

In order to aid in understanding the present invention, parameters required to extract the characteristics of codewords will now be defined.

| Previous Code | | Current Code | |
|---|---|---|---|
| 000010001001000 | | 001000001001000 | |
| LZ(p) | EZ(p) | LZ(c) | EZ(c) |

Here, LZ(p) and LZ(c) denote the number of lead zeros of a previous codeword and the number of lead zeros of a current codeword, respectively. EZ(p) and EZ(c) denote the number of end zeros of a previous codeword and the number of end zeros of a current codeword, respectively. DSV denotes a digital sum value in a codeword stream. That is, in a codeword stream, 0 is calculated as "−1" and 1 is In operation S106, some codes are duplicated to increase the number of usable codes, and the parameter EZ of a codeword is checked in order to determine how to satisfy the run length condition (d,k) of a portion where codewords are connected. The following operations are performed depending on the EZ value.

In operation S107, if $0 \leq EZ < d$, parameter NCG (next code group) designates a second main code group MCG2 so that the next codeword comes from the MCG2.

In operation S108, if $d \leq EZ \leq y$, a determination is made as to whether a codeword is redundant. If it is determined in operation S108 that the codeword is redundant and that the codeword is the original codeword of the two identical codewords, the parameter NCG designates a first decision code group (DCG1) so that the next codeword comes from the DCG1, in operation S109. In this case, if the redundant codeword is a duplicated codeword, the parameter NCG designates a second decision code group (DCG2) so that the next codeword comes from the DCG2, in operation S109.

If it is determined in operation S106 that $y < EZ \leq k$, or if it is determined in operation S108 that the codeword is not redundant while $d \leq EZ \leq y$, the parameter NCG designates a first main code group (MCG1) so that the next codeword comes from the MCG1, in operation S110.

In this way, the NCG of codewords satisfying the condition (d,k) is determined, a code group of a codeword to be attached next to the codeword is determined depending on the NCG, and a portion where the codewords are connected satisfies the (d,k) conditions. Here, the reason for duplicating the codewords satisfying $d \leq EZ \leq y$ is to suppress the DC component of codewords having EZ of 0 to d−1 by DSV controlling a codeword stream using the DSV code groups.

Accordingly, the parameter NCG, which designates a code group of a codeword to come next to a codeword in each code group, designates the MCG2 where the number of end zeros, EZ, of the codeword is equal to or smaller than d−1, designates the DCG1 or DCG2 where the EZ of the codeword is equal to or greater than d and equal to or smaller than y and the codeword is redundant, and designates the MCG1 where the EZ of the codeword is greater than y and equal to or smaller than k or where the EZ of a codeword is equal to or greater than d and equal to or smaller than y and the codeword is not redundant. Therefore, the NCG contributes to improving the DC suppression capability by broadening the width for selection of codes.

A method of grouping codewords and characteristics of each of the code groups will now be described. In operation S111, the number of lead zeros, LZ, of a codeword is used to group codewords so the LZ of a codeword is detected.

Referring to FIG. 3B, where the LZ of a codeword is equal to or smaller than x, the codeword is stored in the MCG1 in operation S112. In operation S113, a codeword having LZ greater than x is stored in the MCG2 so that the characteristics of the parameter INV and the sign of the parameter CSV of the codeword are as close as possible to being opposite to those of a corresponding codeword in the MCG1 having the same decoding value as the codeword to be stored in the MCG2. If there are no codewords which completely satisfy the condition that the characteristics of INV and the sign of CSV are opposite to those of corresponding codewords stored in the MCG1, a codeword having a parameter CSV whose sign is opposite to a corresponding codeword in the MCG1 is preferentially selected, and a codeword having parameter INV whose characteristics are opposite to a corresponding codeword in the MCG1 is secondarily selected. The reason why codeword bits are arranged in this way is that, where the NCG of a codeword is the MCG1 or the MCG2, if codewords having the same decoding value in the MCG1 and the MCG2 simultaneously satisfy the condition (d,k), a codeword with which the DC of a codeword stream is favorably suppressed can be selected from the two codewords because they have a parameter INV of opposite characteristics and a parameter CSV of opposite signs.

Where LZ≦k−y, bit (i), bit (j) and bit (k) are detected in operation S114. If at least one among the three bits, (i), (j) and (k), is "1", a corresponding codeword is stored in the DCG1 in operation S115. If all of the three bits are identified as "0" in the operation S114, a corresponding codeword is stored in the DCG2, in operation S116. Codewords are arranged in DCG1 or DCG2 so that the codewords that also exist in MCG1 or MCG2 are as close as possible at the same locations as those in MCG1 or MCG2 in order to minimize error propagation where errors are generated during decoding. To describe operations S114 through S116 in detail, if the most significant bit, bit11, is "1" (that is, 10xxb: LZ=0) or the upper four bits bit8 through bit11 are all "0" (that is, 0000b: LZ≧4), a corresponding codeword is stored in the DCG1. Otherwise, that is, if LZ=1 like 010xb, if LZ=2 like 0010b, or if LZ=3 like 0001b, a corresponding codeword is stored in the DCG2.

Codes having a value LZ that is equal to or smaller than k−y are stored in DCG because codewords having d≦EZ≦y have been duplicated. Where a redundant codeword is decoded, the next codeword is referred to in order to properly decode corresponding data. To be more specific, if the next codeword comes from the DCG1, a redundant code to be decoded is demodulated into the decoding data for the original codeword of the two same codewords. If the next codeword comes from the DCG2, a redundant code to be decoded is demodulated into the decoding data for the duplicated codeword of the two same codewords.

Here, the main conversion code groups MCG1 and MCG2 are defined as code groups having codewords to follow a non-redundant codeword, and the redundant code demodulation conversion code groups DCG1 and DCG2 are defined as code groups having codewords to follow a redundant codeword. These conversion code groups may be referred to as data modulation code groups, and first through third DSV code groups may be referred to as DC suppression control code groups. Accordingly, even if these code groups are differently indicated according to the purposes of use, it is considered that the meaning does not change if not departing from the above-described meaning.

In order that codes having d≦EZ≦y are connected to the codewords within the DCG1 and DCG2 while satisfying (d,k) conditions, the sum of the number of end zeros of a previous codeword, EZ(p), and the number of lead zeros of a current codeword, LZ(c), must satisfy d≦EZ(p)+LZ(c)≦k, where the LZ(c) of the DCG1 or DCG2 must satisfy LZ≦k−y.

If two codewords "010101000010" exist within the MCG1, as shown in FIG. 4C, that is, if the decoding value for the original codeword "010101000010" of the two same codewords is 129, and the NCG for the original codeword is DCG1, and the decoding value for the duplicated codeword "010101000010" is 130, and the NCG for the duplicated codeword is DCG2, the codewords "010101000010" are demodulated to 129 or 130 depending on whether the next codewords come from the DCG1 or DCG2.

The i-th, j-th and k-th bits designate certain particular bits. In the present invention, in the case of 8–12 modulation, each of i, j and k range from 0 to 11. Where a codeword is to be found in a DCG group where each of i, j and k is a number from 0 to 11, there should be more than 256 codewords in each of the DCG1 and the DCG2 where m=8. Therefore, for instance, in the case of I=4, j=7 and k=10, if the number of codeword is more than 256, which occurs either where bit(4), bit(7) and bit(10) are all 0, or where any one of bit(4), bit(7) and bit(10) is 1, then the corresponding values of bit(4), bit(7) and bit(10) are used for generating codewords.

FIGS. 4A through 4E show the code conversion tables of the main conversion code groups MCG1 and MCG2 and redundant code demodulation conversion code groups DCG1 and DCG2 produced by the method illustrated in FIGS. 3A and 3B.

Production and arrangement of DSV code groups will now be described. In the present invention, the DSV code groups are provided to suppress the DC component of a codeword stream.

In operation S117, codeword having an LZ of 1 to 8 are stored in the first DSV code group so that the sign of CSV and the characteristics of INV of each of the codeword are opposite to those of a corresponding codeword in MCG2. In operation S118, codeword having an LZ of 0, 6 or 7 are stored in the second DSV code group so that the sign of CSV and the characteristics of INV of each of the codeword are opposite to those of corresponding codeword in DCG1. In operation S119, codeword having LZ of 1 to 3 are stored in the third DSV code group so that the sign of CSV and the characteristics of INV of each of the codeword are opposite to those of a corresponding codeword in DCG2.

Hence, in a DSV code group selection method, where the EZ(p) of a codeword is 0 while d≦EZ(p)+LZ(c)≦k, a current codeword can be selected from the first DSV code group in which codewords having LZ(c) of 1 to 8 are included. Where a previous code is the original codeword among the two identical codewords while having an EZ(p) of 1 to 3, a current codeword is selected from the second DSV code group in which codewords having LZ(c) of 0, 6 or 7 are included. Likewise, where a previous code is the duplicated codeword among the two identical codewords while having an EZ(p) of 1 to 3, a current codeword is selected from the third DSV code group in which codewords having an LZ(c) of 1–3 are included.

Here, the code conversion table of the main conversion code group MCG2 and the first DSV code group for controlling DC suppression is shown in FIG. 5, the first DSV code group comprises 102 codewords having an LZ of 1 to 8, and codewords having an EZ of 0 to 7 among the 102 codewords are duplicated. The code conversion table of the redundant code demodulation conversion code group DCG1 and the second DSV code group for controlling DC suppression is shown in FIG. 6, the second DSV code group is made up of 27 codewords having an LZ of 0, 6 or 7, and codewords having an EZ of 0 to 7 among the 27 codewords are all duplicated. The code conversion table of the redundant code demodulation conversion code group DCG2 and the third DSV code group for controlling DC suppression is shown in FIG. 7, the third DSV code group is made up of 4 codewords having an LZ of 1 to 3, and codewords having an EZ of 0 to 7 among the 4 codewords are all duplicated.

Referring again to FIG. 3B, codewords produced as described above are stored in corresponding code groups, and a determination is made in operation 120 whether an input codeword is the last codeword. If it is determined that the input codeword is the last codeword, the RLL code group producing method described with reference to FIGS. 3A and 3B is concluded. Otherwise, i (where i is 0, 1, . . . , $2^n-1$) is increased in operation S121 of FIG. 3A, and the process returns to the operation S102 of producing codewords.

The characteristics of demodulation codewords which are produced by the code producing method shown in FIGS. 3A and 3B and applied to the present invention are shown in FIG. 8. The two main conversion code groups MCG1 and MCG2 include no identical codewords, and the two redundant code demodulation conversion code groups DCG1 and DCG2 include no identical codewords.

Codewords are arranged within a pair of code groups capable of DC control (for example, the MCG1 and the MCG2, the MCG2 and the first DSV code group, the DCG1 and the second DSV code group, and the DCG2 and the third DSV code group) so that a codeword in one code group has parameters INV and CSV opposite to those of a corresponding codeword in the other code group. In order to increase the probability of controlling DC suppression, the DSV code groups have a redundant codeword producing condition which is different from that of the main conversion code groups MCG1 and MCG2 or the redundant code demodulation conversion code groups DCG1 and DCG2. That is, the main conversion code groups or redundant code demodulation conversion code groups have a redundant codeword producing condition in which the number of end zeros is 1 to 3 (1000xxxxxx10 or 1001xxxxxx10 in MCG1 are exceptions). On the other hand, the DSV code groups has a redundant codeword producing condition in which the number of end zeros is 0 to 7, in order to produce as many redundant codewords as possible, resulting in an increase in the number of codewords. In order to achieve DC suppression control together with the redundant code demodulation conversion code groups DCG1 and DCG2, the DSV code groups remove a conventional code production precondition in which the codewords within a pair of code groups capable of DC control (for example, a pair of the DCG1 and second DSV code group and a pair of the DCG2 and third DSV code group) must have the same characteristics (for example, the same LZ condition).

In order to produce code groups for controlling DC suppression together with the redundant code demodulation conversion code groups, codewords which violate the LZ condition for all of the codewords within the redundant code demodulation conversion code groups are classified into the second and third DSV code groups. Here, the LZ condition of all of the codewords within the redundant code demodulation conversion code groups is that the LZ of codewords must be 5 or less, and the LZ condition of the codewords within the second and third DSV code groups must be no greater than k, which corresponds to the maximum run length.

Figure 9:
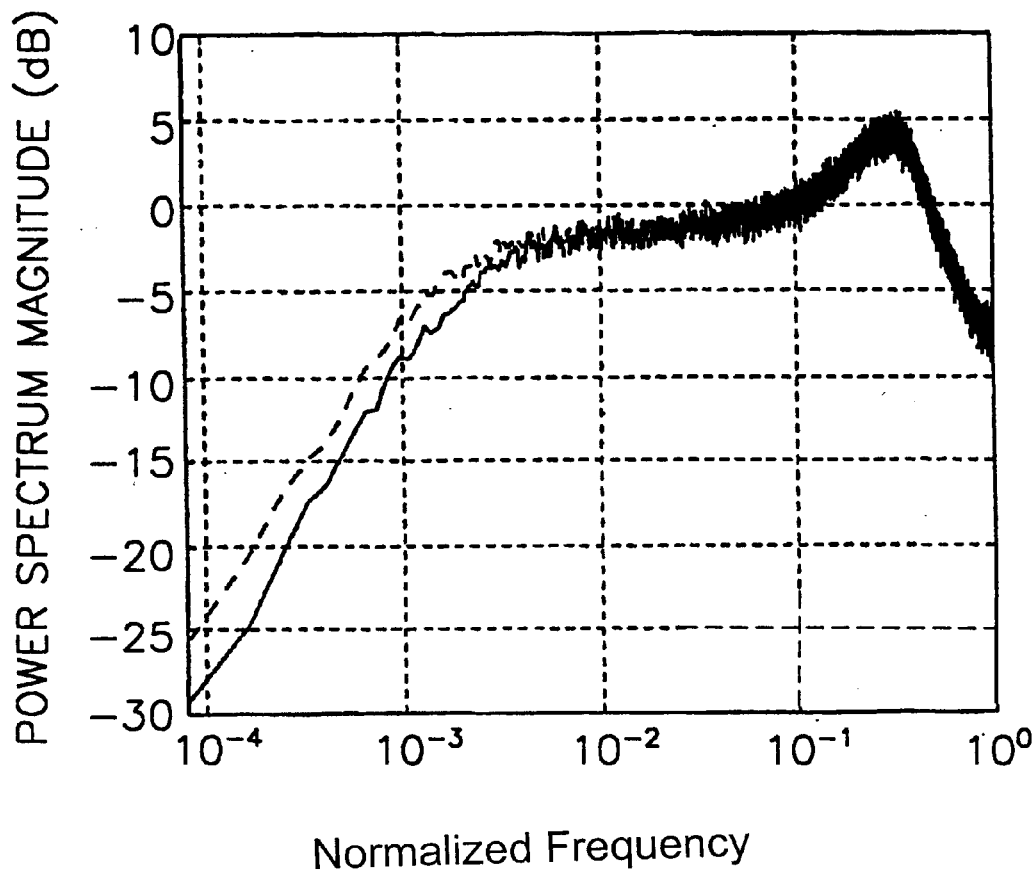
FIG. 9 is a graph showing the effect of DC suppression improvement where the codewords in code groups proposed by the present invention are used.

Accordingly, as shown in FIG. 9, the DC component of a code stream is more effectively suppressed due to an increase in the probability of DC suppression control in the case of modulation using the codewords in modulation code groups according to the present invention than in the case of modulation using the codewords within the conventional modulation groups shown in FIG. 1 or 2.

A method of modulating and demodulating RLL codes will now be described with reference to the code conversion tables of FIGS. 4 through 7 which are produced by the method shown in FIGS. 3A and 3B.

Figure 10A:
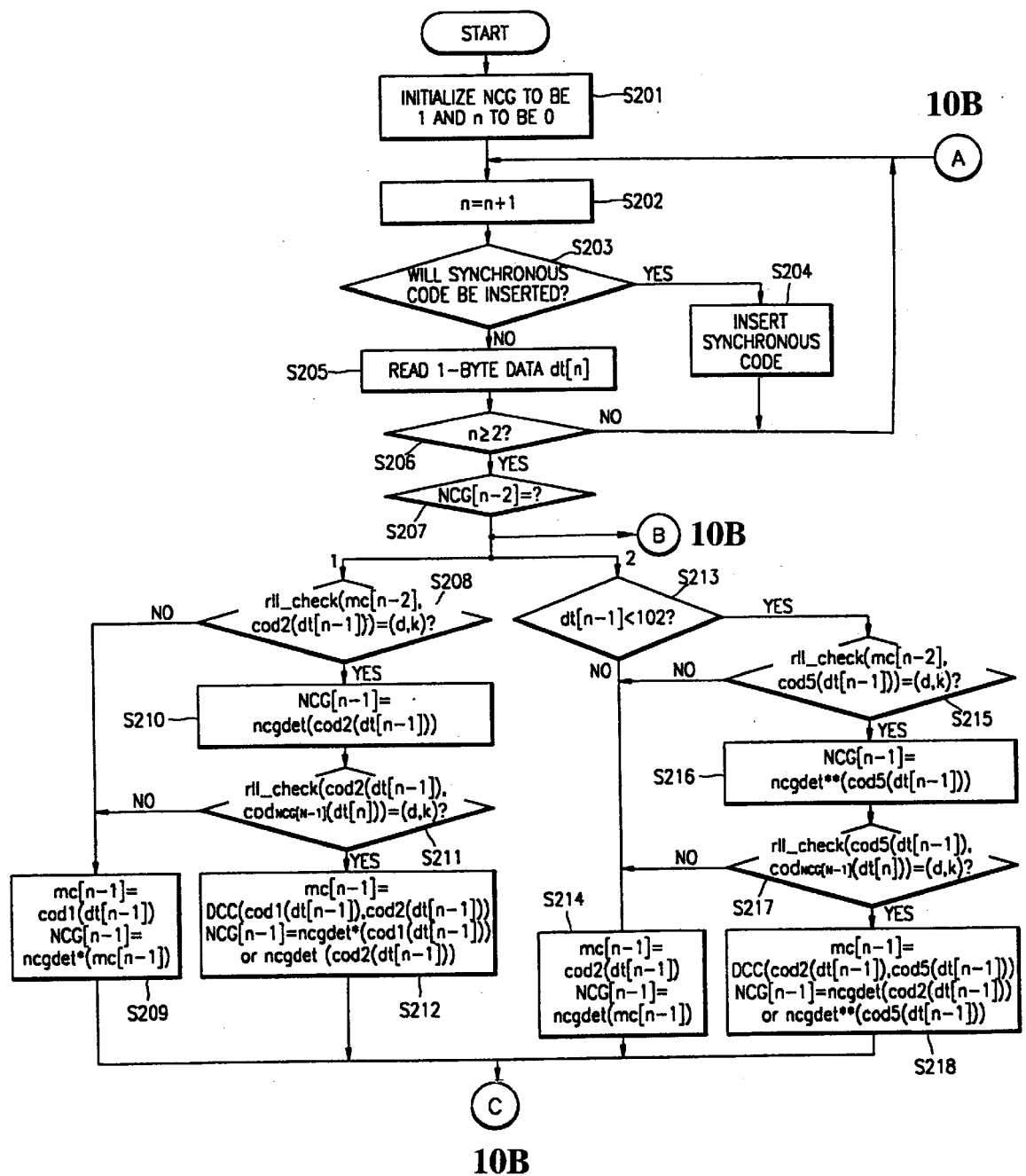
FIGS. 10A and 10B are flowcharts illustrating a modulation method according to an embodiment of the present invention.
Figure 10B:
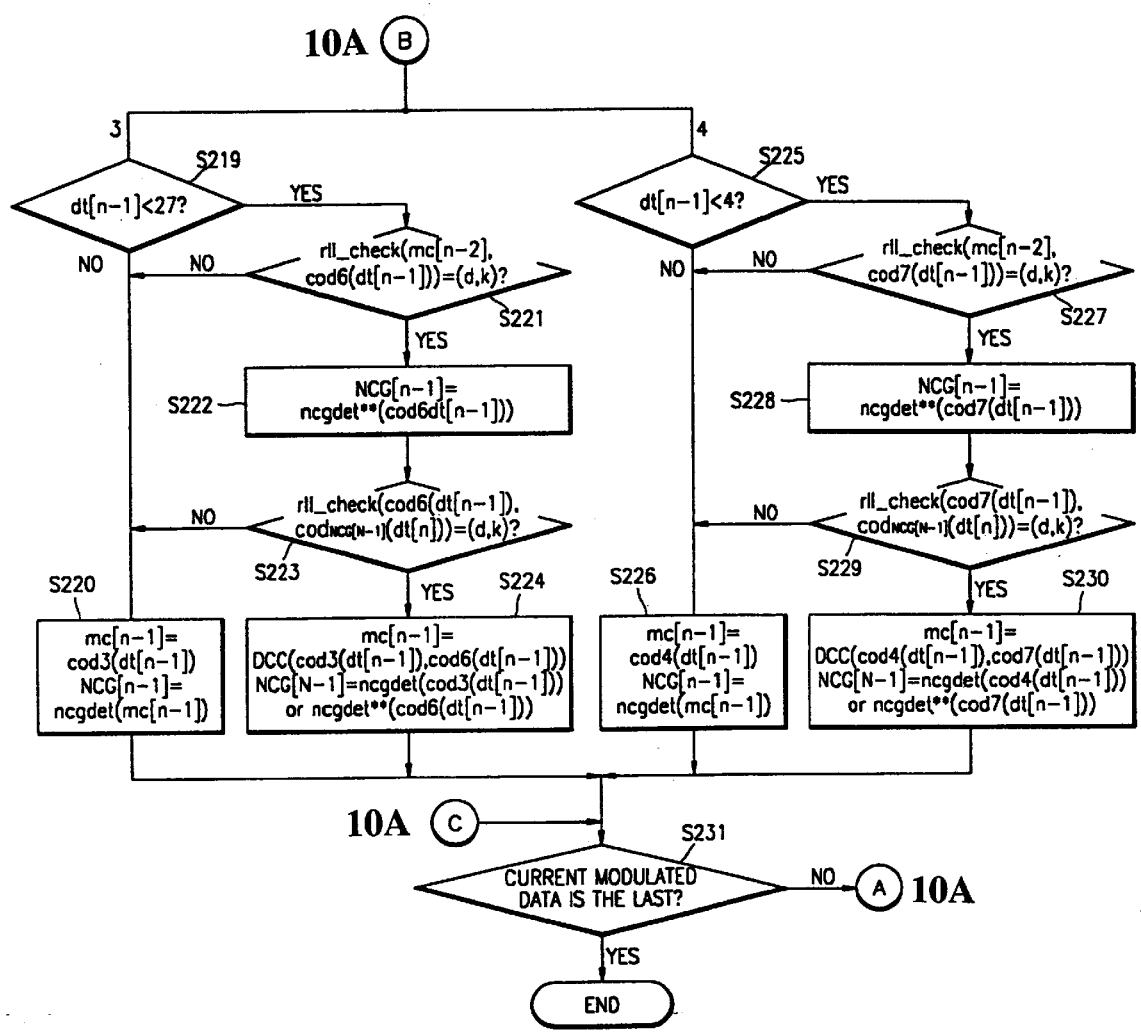

Referring to FIGS. 10A and 10B, which are flowcharts illustrating a modulation method according to an embodiment of the present invention, parameter NCG representing the next code group is initialized to 1 and a variable n is initialized to 0 in operation S201. The variable n increases by 1 in operation S202. It is determined whether to insert a synchronous code in operation S203. If it is determined to insert a synchronous code, a routine for inserting a synchronous pattern which is favorable for suppressing DC is executed in operation S204, and the operation S202 for increasing the variable n by 1 is again performed. A rule that the codeword next to the synchronous pattern must come from a specific codeword group is needed. Therefore, in an embodiment of the present invention, an NCG for designating the codeword next to the synchronous pattern is 2, and the codeword for the next data is searched for in the MCG2.

If it is determined in operation S203 not to insert a synchronous pattern, 1-byte data dt[n] is read and temporarily stored in operation S205. Here, it is assumed that a time to modulate is n−1, a time after modulation has already been completed is n−2, and a time to perform another modulation is n.

Where data of 2 bytes or more (n≧2) are read in operation S206, NCG[n−2], which is the NCG of the modulated codeword for previously-input data, is checked in operation S207. If it is determined in operation S207 that NCG[n−2] is 1, the codeword for data to be currently modulated is searched for in MCG2, the found codeword is represented as cod2(dt[n−1]), and it is determined whether a portion where a previously modulated codeword mc[n−2] is connected to a currently modulated codeword cod2(dt[n−1]) violates the run length condition (d,k) in operation S208, which is expressed as rll_check((mc[n−2],cod2(dt[n−1]))=(d,k) ? in FIG. 10A. In the condition (d,k) used in the present invention, d is equal to 1, and k is equal to 8. In FIGS. 10A and 10B, cod1(dt[n−1]) denotes searching for a modulation codeword for input data in MCG1, cod2(dt[n−1]) denotes searching for a modulation codeword for input data in MCG2, cod3(dt[n−1]) denotes searching for a modulation codeword for input data in DCG1, cod4(dt[n−1]) denotes searching for a modulation codeword for input data in DCG2, cod5(dt[n−1]) denotes searching for a modulation codeword for input data in the first DSV code group, cod6(dt[n−1]) denotes searching for a modulation codeword for input data in the second DSV code group, and cod7(dt[n−1]) denotes searching for a modulation codeword for input data in the third DSV code group.

If it is determined in operation S208 that the run length condition is violated, data dt[n−1] to be currently modulated is modulated only into a codeword which is within MCG1, and NCG[n−1] is obtained as defined in FIG. 12 in operation S209.

FIG. 11 shows a table which defines NCG[n−1] representing a code group having a codeword next to the currently modulated codeword mc[n−1] where the bit portion where the previously modulated codeword mc[n−2] is connected to the currently codeword cod2(dt[n−1]) to be modulated does not violate the run length condition (d,k). In FIG. 10A, the NCG[n−1] of FIG. 11 is defined as ncgdet(mc[n−1]).

The value of NCG[n−1] varies with the EZ of the previously modulated codeword in one among the conversion code groups MCG1, MCG2, DCG1 and DCG2. That is, where EZ is 0, NCG[n−1] is 2 (which denotes the main code group MCG2). Where EZ is 1 to 3, NCG[n−1] is 3 (which denotes the redundant code demodulation decision code group DCG1) or 4 (which denotes the redundant code demodulation decision code group DCG2) depending on the values of specific bits of a current codeword SRI. Where EZ exceeds 3, NCG[n−1] is 1 (which denotes the main code group MCG1).

FIG. 12 shows an exception table which defines NCG[n−1] as representing a code group having a codeword next to the currently modulated codeword mc[n−1]. As shown in FIG. 12, where a previous codeword exists in the MCG1, and the previous codeword is 1000xxxxxx10 or 1001xxxxxx10, NCG[n−1] is not 3 or4 but 1, even though EZ is 1. In FIG. 10A, the NCG[n−1] of FIG. 12 is defined as ncgdet*(mc[n−1]).

The value of NCG[n−1] varies with the EZ of the previously modulated codeword in one among the conversion code groups MCG1, MCG2, DCG1 and DCG2. That is, where EZ is 0, NCG[n−1] is 2 (which denotes the main code group MCG2). Where EZ is 1 to 3, NCG[n−1] is 3 (which denotes the redundant code demodulation decision code group DCG1) or 4 (which denotes the redundant code demodulation decision code group DCG2) depending on the values of specific bits of a current codeword SR1. However, the NCG[n−1] of a codeword 1000xxxxxx10 or 1001xxxxxx10 among the codewords within the MCG1 is 1. Where EZ exceeds 3, NCG[n−1] is 1 (which denotes the main code group MCG1).

FIG. 13 shows a table which defines NCG[n−1] representing a code group having the codeword next to the current modulated codeword mc[n−1] where the previous codeword is modulated in one among the DSV code groups. In FIG. 10A, the NCG[n−1] of FIG. 13 is defined as ncgdet**(mc[n−1]).

The value of NCG[n−1] varies with the EZ of the previous codeword SR0 modulated in a DSV code group. That is, where EZ is 0 to 7, NCG[n−1] is 3 (which denotes the redundant code demodulation decision code group DCG1) or 4 (which denotes the redundant code demodulation decision code group DCG2) depending on the values of specific bits of a current codeword SR1. Where EZ exceeds 8, NCG[n−1] is 1 (which denotes the main code group MCG1).

That is, if the previous codeword SR0 is found in one among the conversion code groups MCG1, MCG2, DCG1 and DCG2, the NCG is obtained as defined in FIG. 11 or 12. If the previous codeword SR0 is found in one among the first, second and third DSV code groups for DC suppression control, the NCG is obtained as defined in FIG. 13. However, where the previous codeword SR0 is found in one among the first, second and third DSV code groups for DC suppression control, if the EZ of the previous codeword SR0 is 8, NCG is 1 (which denotes the MCG1). If the EZ of the previous codeword SR0 is 0 to 7, NCG is 3 (which denotes the DCG1) or 4 (which denotes the DCG2) depending on the values of specific bits of the current codeword SR1.

If it is determined in operation S208 of FIG. 10A that the run length condition is satisfied, a codeword, which is current data dt[n−1] to be modulated, is searched for in the MCG2 capable of DC suppression together with the MCG1, and the NCG[n−1] representing a code group having the codeword next to the current codeword to be modulated is temporarily obtained as defined in FIG. 11, in operation S210. In operation S211, it is determined whether the run length between a current codeword cod2(dt[n−1]) to be modulated and the next codeword $cod_{NCG[N-1]}(dt[n])$ to be modulated the next time in a code group designated by the NCG[n−1] is violated.

If it is determined in operation S211 that the run length condition is violated, dt[n−1] can be modulated only into a codeword within MCG1 and the NCG[n−1] is obtained as defined in FIG. 12 in operation S209. In operation S212, if the run length condition is not violated, dt[n−1] can be modulated into a codeword within MCG1 or MCG2, and selection of one of the two groups is made so that a codeword in the selected code group preferably suppresses DC. In FIG. 10A, the selection of a codeword favorable for DC suppression is expressed as DCC(cod1(dt[n−1], cod2(dt[n−1]))). NCG[n−1] is determined depending on the type of a code group and a codeword determined in operation S212. That is, where dt[n−1] is selected from the MCG1, NCG[n−1] is determined by FIG. 12. Where dt[n−1] is selected from the MCG2, NCG[n−1] is determined by FIG. 11.

If it is determined in operation S207 that NCG[n−2] is 2, it is determined whether current data dt[n−1] to be currently modulated is less than 102, in operation S213. If it is determined in operation S213 that data dt[n−1] is greater than 101, a codeword for the data is searched for in the MCG2, the found codeword is expressed as cod2(dt[n−1]), and NCG[n−1] is obtained as defined in FIG. 11, in operation S214. If it is determined in operation S213 that dt[n−1] is smaller than or equal to 101, it is determined whether the run length condition (d,k) between the previously modulated codeword mc[n−2] and the codeword for dt[n−1], cod5(dt[n−1]), in the first DSV code group is violated, in operation S215, which is expressed as rll check((mc[n−2], cod5(dt[n−1]))=(d,k)? in FIG. 10A.

If it is determined in operation S215 that the run length condition is violated, the operation S214, in which dt[n−1] is modulated only into a codeword which is within MCG2 and the NCG[n−1] is obtained as defined in FIG. 11, is performed. If it is determined in operation S215 that the run length condition is satisfied, a codeword for data dt[n−1] is searched for in the first DSV code group capable of DC suppression together with the MCG2, and the NCG[n−1] is temporarily obtained as defined in FIG. 13, in operation S216. In operation S217, it is determined whether the run length condition between cod5(dt[n−1]) and the next codeword $cod_{NCG[N-1]}$(dt[n]) to be modulated the next time in a code group designated by the NCG[n−1] is violated.

If it is determined in operation S217 that the run length condition is violated, the operation S214, in which dt[n−1] is modulated only into a codeword which is within MCG2 and the NCG[n−1] is obtained as defined in FIG. 11, is performed. If the run length condition is not violated, dt[n−1] can be modulated into a codeword which is within MCG2 or within the first DSV code group, and a codeword into which data is to be modulated is selected from a code group having a codeword which is favorable for DC suppression, in operation S218. In FIG. 10A, the selection of a codeword favorable for DC suppression is expressed as DCG(cod2(dt[n−1]), cod5(dt[n−1])). NCG[n−1] is determined depending on the type of code group and codeword determined in operation S218. That is, where dt[n−1] is selected from the MCG2, NCG[n−1] is determined as defined in FIG. 11. Where dt[n−1] is selected from the first DSV code group, NCG[n−1] is determined as defined in FIG. 13.

If it is determined in operation S207 that NCG[n−2] is 3, it is determined whether current data dt[n−1] to be currently modulated is smaller than 27, in operation S219 of FIG. 10B. If it is determined in operation S219 that data dt[n−1] is greater than 26, a codeword for the data is searched for in the DCG1, the found codeword is expressed as cod3(dt[n−1]), and NCG[n−1] is obtained as defined in FIG. 11, in operation S220. If it is determined in operation S219 that dt[n−1] is smaller than or equal to 26, it is determined in operation S221 whether the run length condition (d,k) between the previously modulated codeword mc[n−2] and a codeword for dt[n−1], cod6(dt[n−1]), in the second DSV code group is violated, which is expressed as rll_check((mc[n−2], cod6(dt[n−1]))=(d,k)? in FIG. 10B.

If it is determined in operation S221 that the run length condition is violated, the operation S220, in which dt[n−1] is modulated only into a codeword which is within DCG1 and the NCG[n−1] is obtained as defined in FIG. 11, is performed. If it is determined in operation S221 that the run length condition is satisfied, a codeword for data dt[n−1] is searched for in the second DSV code group capable of DC suppression together with the DCG1, and the NCG[n−1] is temporarily obtained as defined in FIG. 13, in operation S222. In operation S223, it is determined whether the run length condition between cod6(dt[n−1]) and the next codeword $cod_{NCG[N-1]}$(dt[n]) to be modulated the next time in a code group designated by the NCG[n−1] is violated. If it is determined in operation S223 that the run length condition is violated, the operation S220, in which dt[n−1] is modulated only into a codeword which is within DCG1 and the NCG[n−1] is obtained as defined in FIG. 11, is performed. If the run length condition is not violated, dt[n−1] can be modulated into a codeword which is within DCG1 or within the second DSV code group, and a codeword into which data is to be modulated is selected from a code group having a codeword which is favorable for DC suppression, in operation S224. In FIG. 10B, the selection of a codeword favorable for DC suppression is expressed as DCC(cod3(dt[n−1]), cod6(dt[n−1])). NCG[n−1] is determined depending on the type of a code group and a codeword determined in operation S224. That is, where dt[n−1] is selected from the DCG1, NCG[n−1] is determined as defined in FIG. 11. Where dt[n−1] is selected from the second DSV code group, NCG[n−1] is determined as defined in FIG. 13.

If it is determined in operation S207 that NCG[n−2] is 4, it is determined in operation S225 whether current data dt[n−1] to be modulated is smaller than 4. If it is determined in operation S225 that data dt[n−1] is greater than 3, a codeword for the data is searched for in the DCG2, the found codeword is expressed as cod4(dt[n−1]), and NCG[n−1] is obtained as defined in FIG. 11, in operation S226.

If it is determined in operation S225 that dt[n−1] is smaller than or equal to 3, it is determined in operation S227 whether the run length condition (d,k) between the previous modulated codeword mc[n−2] and a codeword for dt[n−1], cod7(dt[n−1]), in the third DSV code group is violated. This determination is expressed as rll_check(mc[n−2], cod7(dt[n−1]))=(d,k)?, in FIG. 10B.

If it is determined in operation S227 that the run length condition is violated, the operation S226, in which dt[n−1] is modulated only into a codeword which is within DCG2 and the NCG[n−1] is obtained as defined in FIG.11, is performed. If it is determined in operation S227 that the run length condition is satisfied, a codeword for data dt[n−1] is searched for in the third DSV code group capable of DC suppression together with the DCG2, and the NCG[n−1] is temporarily obtained as defined in FIG. 13, in operation S228. In operation S229, it is determined whether the run length condition between cod7(dt[n−1]) and the next codeword $cod_{NCG[N-1]}$(dt[n]) to be modulated the next time in a code group designated by the NCG[n−1] is violated.

If it is determined in operation S229 that the run length condition is violated, the operation S226, in which dt[n−1] is modulated only into a codeword which is within DCG2 and the NCG[n−1] is obtained as defined in FIG. 11, is performed. If the run length condition is not violated, dt[n−1] can be modulated into a codeword within DCG2 or the third DSV code group, and a codeword into which data is to be modulated is selected from a code group having a codeword which is favorable for DC suppression, in operation S230. In FIG. 10B, the selection of a codeword favorable for DC suppression is expressed as DCC(cod4(dt[n−1]), cod7(dt[n−1])). NCG[n−1] is determined depending on the type of a code group and a codeword determined in operation S230. That is, where dt[n−1] is selected from the DCG2, NCG[n−1] is determined as defined in FIG. 11. Where dt[n−1] is selected from the third DSV code group, NCG[n−1] is determined as defined in FIG. 13.

After current input data is modulated, it is determined whether the modulated data is the last, in operation S231. If the modulated data is the last, this process is concluded. Otherwise, the operation S202 is again performed.

Figure 14B:
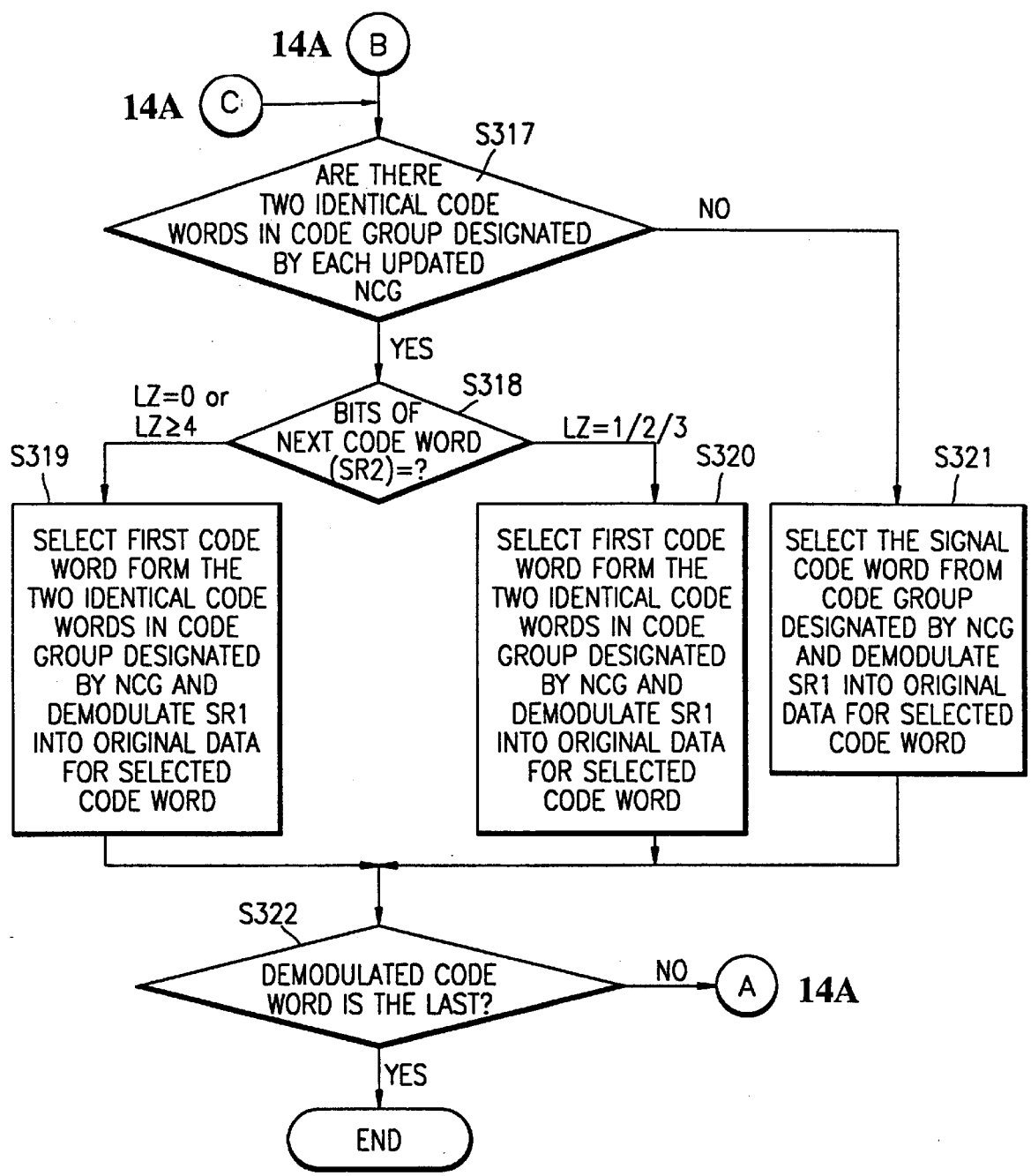

In FIGS. 14A and 14B, which are flowcharts illustrating a demodulation method according to an embodiment of the present invention, an NCG value is set to be an initial value (here, 1), and a variable n is set to be 0, in operation S301. In operation S302, the variable n increases by 1. In operation S303, a new codeword is input and stored in a shift register (not shown). Here, a shift register in which a current codeword to be currently demodulated is stored is referred to as SR1, a shift register in which a previous demodulated codeword is stored is referred to as SR0, and a shift register in which a next codeword to be demodulated the next time is stored is referred to as SR2.

In operation S304, it is determined whether variable n is equal to or greater than 2. If variable n is equal to or smaller than 1, only a new codeword is received, and the operation S302 for increasing variable n by 1 is again performed. If it is determined in operation S304 that variable n is equal to or greater than 2, a determination is made as to whether the previous codeword SR0 is a synchronous signal SYNC, in operation S305. If the previous codeword SR0 is a synchronous signal SYNC, a synchronous restoring routine for synchronous protection and interleaving is performed in operation S306. Then, the operation S302 is again performed.

If it is determined in operation S305 that the previous codeword SR0 is not a synchronous signal, a determination is made as to whether variable n is greater than or equal to 3, in operation S307. If variable n is greater than or equal to 3, an NCG determination process (operations S308 through S316) for searching for a code group having the current codeword SR1 is performed. Otherwise, a demodulation process (operations S317 through S322 in FIG. 14B) is performed.

That is, if variable n is greater than or equal to 3, a determination is made as to whether the previous codeword SR0 belongs to a conversion code group MCG1, MCG2, DCG1 or DCG2, in operation S308. If it is determined that the previous codeword SR0 belongs to a conversion code group MCG1, MCG2, DCG1 or DCG2, the EZ value of SR0 is checked in operation S309.

If it is determined in operation S309 that the EZ value of the previous codeword SR0 is smaller than the minimum run length d, that is, if EZ is 0, NCG representing a code group having a current codeword being demodulated is updated to 2, which represents the MCG2 or the first DSV code group, in operation S310. If the EZ value of SR0 is equal to or greater than the minimum run length d and equal to or smaller than a codeword duplication parameter y, that is, if $1 \leq EZ \leq 3$, it is determined in operation S311 whether the 4 upper bits of the previous codeword SR0 represent 8 (1000b) or 9 (1001b) where NCG is 1 and the EZ is 1. If the four upper bits of the previous codeword SR0 do not represent 8 (1000b) or 9 (1001b), all bits of the current codeword SR1 being demodulated are checked, in operation S312. If the LZ of the current codeword SR1 is 0 or greater than or equal to 4 in operation S312, NCG representing a code group including the current codeword SR1 is updated to 3, which represents the DCG1 or second DSV code group, in operation S313. If the LZ of the current codeword SR1 is 1, 2 or 3, NCG representing a code group including the current codeword SR1 is updated to 4, which represents the DCG2 or third DSV code group, in operation S314. If it is determined in operation S311 that the previous codeword SR0 is included in MCG1, the EZ value thereof is 1, and the four upper bits thereof represent 8 (1000b) or 9 (1001b), or if it is determined in operation S309 that the EZ value of the previous codeword SR0 is greater than duplication parameter y, NCG designating a code group having a current codeword to be currently modulated is updated to 1, which represents MCG1 or MCG2, in operation S315.

If it is determined in operation S308 that the previous codeword SR0 belongs to none of the MCG1, MCG2, DCG1 and DCG2, it is determined in operation S316 whether the EZ of the previous codeword SR0 is 8. If the EZ of the previous codeword SR0 is 8, operation S315 is performed, in which NCG designating a code group having a current codeword to be currently modulated is updated to 1. Otherwise, the operation S312 for checking the bits of the current codeword to be currently demodulated, SR1, is performed.

In operation S317 of FIG. 14B, a determination is made as to whether a code group designated by each of the updated NCGs has two identical codewords. If it is determined in operation S317 that two identical codewords exist in the designated code group, the bits of the next codeword SR2 are checked in operation S318. If the LZ value of the next codeword is 0 or greater than or equal to 4, the code to be currently demodulated is identified as the first codeword of the two identical codewords and is demodulated into the original data for the first codeword in operation S319. If the LZ value of the next codeword is 1, 2 or 3, the code to be currently demodulated is identified as the second codeword of the two identical codewords and is demodulated into the original data for the second codeword in operation S320.

If it is determined in operation S317 that a code group designated by the updated NCG has only a single codeword SR1 to be currently demodulated, the single codeword SR1 is selected from the code group designated by the updated NCG and demodulated into the original data in operation S321.

After the current codeword SR1 is demodulated, a determination is made as to whether the demodulated codeword is the last in operation S322. If the demodulated codeword is the last, this demodulation process is concluded. Otherwise, the operation S302 of FIG. 14A for increasing variable n by 1 is again performed.

According to the present invention as described above, the DC suppression capability is improved by producing DC suppression control DSV code groups by making the most of the characteristics (for example, parameters CSV and INV) of codewords in data modulation conversion code groups.

In the present invention, the DC suppression control DSV code groups are produced by making the most of the characteristics of codewords in conversion code groups, such as, the sign of parameter CSV representing the DC value within a codeword and the characteristics of parameter INV predicting the DSV transition direction of the next codeword, although they have separate codewords from data modulation conversion code groups, and yet relaxing the duplicate c the condition of usable codewords compared to the data modulation conversion code groups. Therefore, the probability of DC suppression control further increases, so that the DC component of a code stream can be further suppressed.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of modulating input data into a run length limited (RLL) code which is favorable for DC suppression, wherein the RLL code is expressed as (d,k,m,n), where d denotes a minimum run length, k denotes a maximum run length, m denotes a bit length of data, and n denotes a bit length of a codeword, the method comprising:

modulating m-bit input data into a codeword selected from a predetermined number of first code groups for data modulation and a predetermined number of second code groups for DC suppression control, the first and second code groups having redundant codewords, wherein:

each codeword has a first parameter CSV (codeword sum value) which represents a direct current (DC) value of the codeword and a second parameter INV which predicts a digital sum value transition direction of a next codeword, each first parameter having a sign and each second parameter having a characteristic;

the sign of the first parameter of codewords within the first code groups is opposite the sign of the first parameter of corresponding codewords within the second code groups;

the characteristic of the second parameter of codewords within the first code groups is opposite to the characteristic of the second parameter of corresponding codewords within the second code groups; and the first and second code groups have different redundant codeword generation conditions.

2. The method of claim 1, wherein a number of codewords in the second code groups is increased by relaxing a redundant codeword generation condition for the second code groups compared to the first code groups, so that a probability of suppressing a DC component of a code stream during modulation is improved.

3. The method of claim 1, wherein codewords having 1 to 3 end zeros within the first code groups have duplicates, and codewords having 0 to 7 end zeros within the second code groups have duplicates.

4. The method of claim 1, wherein the predetermined number of first code groups is four, and the predetermined number second code groups is three.

5. The method of claim 4, wherein:

the four code groups comprise main code groups MCG1 and MCG2, and redundant code demodulation conversion code groups DCG1 and DCG2 and the three code groups comprise first, second and third DSV code groups for DC suppression control each codeword has a predetermined number (LZ) of lead zeros;

each MCG1 codeword has an LZ which is smaller than or equal to an MCG classification parameter x;

each MCG2 codeword has an LZ which is greater than or equal to the MCG classification parameter x;

the MCG1 and the MCG2 have no identical codewords;

each DCG1 and each DCG2 codeword has an LZ which is equal to or smaller than a difference between the maximum run length k and a codeword duplication parameter y;

the codewords are disposed in DCG1 or DCG2 depending on values of specific bits of the codewords;

the sign of the first parameter of the codewords in the first DSV code group is opposite to the sign of the first parameter of corresponding codewords in the MCG2 and the characteristic of the second parameter of codewords in the first DSV code group is opposite to the characteristic of the second parameter of corresponding codewords in MCG2;

the sign of the first parameter of the codewords in the second DSV code group is opposite to the sign of the first parameter of corresponding codewords in the DCG1 and the characteristic of the second parameter of codewords in the second DSV code group is opposite to the characteristic of the second parameter of corresponding codewords in the DCG1; and the sign of the first parameter of the codewords of the third DSV code group is opposite to the sign of the first parameter of corresponding codewords in the DCG2 and the characteristic of the second parameter of codewords in the third DSV code group is opposite to the characteristic of the second parameter of corresponding codewords in the DCG2.

6. The method of claim 5, wherein d is 1, k is 8, m is 8, n is 12, the MCG classification parameter x is 1, and the code duplication parameter y is 3.

7. The method of claim 5, further comprising:

selecting a codeword from a code group pair consisting of:
the MCG1 and the MCG2,
the MCG2 and the first DSV code group,
the DCG1 and the second DSV code group, or
the DCG2 and the third DSV code group.

8. The method of claim 4, wherein each codeword has a third parameter (NCG) which designates a code group among the first and second code groups having a codeword coming next to said each codeword, and the third parameter set for the first code groups is different from that set for the second code group.

9. The method of claim 5, wherein the DC suppression control code group together with the redundant code demodulation conversion code groups comprises codewords which violate the LZ condition among all of the codewords in the redundant code demodulation conversion code group.

10. The method of claim 9, wherein the lead zero number of all of the codewords within the redundant code demodulation conversion code group is less than or equal to 5, and the lead zero number of each of the codewords within the DC suppression control code group capable of controlling DC suppression together with the redundant code demodulation conversion code group is less than or equal to the maximum run length k.

11. A method of modulating m-bit input data into a run length limited (RLL) code which is expressed as (d,k,m,n), where d denotes a minimum run length, k denotes the maximum run length, m denotes the bit length of data, and n denotes the bit length of a codeword, the method comprising:

searching for a codeword for the m-bit input data in a data modulation code group designated as a code group having a codeword to come next to a previously modulated codeword;

determining whether the run length condition (d,k) between a found codeword and the previous codeword/next codeword is violated;

modulating the m-bit input data into the found codeword and determining a code group having a codeword to come next to the modulated codeword, if the run length condition is violated;

modulating the m-bit input data into a codeword searched in a code group, which is favorable for DC suppression, among a data modulation code group designated as a code group having a codeword to come next to the previous codeword and a corresponding DC suppression control code group, if the run length condition is not violated; and determining a code group having a codeword to come next to the modulated codeword.

12. The method of claim 11, wherein codewords having 1 to 3 end zeros within the data modulation code group have duplicates, and codewords having 0 to 7 end zeros within the DC suppression control code group have duplicates.

13. The method of claim 12, wherein a parameter NCG (next code group) designating a code group having a codeword coming next to a codeword is set on each of the codewords within each of the code groups, and the parameter NCG for the data modulation code group is different from that for the DC suppression control code group.

14. The method of claim 11, wherein the minimum run length (d) is 1, and the maximum run length (k) is 8.

15. The method of claim 11, wherein the data modulation code group comprises main code groups MCG1 and MCG2 and redundant code demodulation conversion code groups DCG1 and DCG2, and the DC suppression control code group comprises first, second and third DSV code groups.

16. The method of claim 15, wherein:

each codeword has a predetermined number (LZ) of lead zeros, a first parameter CVS (codeword sum value) which represents a direct current (DC) value of a codeword and a second parameter INV which predicts a digital sum value transition direction of a next codeword, each first parameter having a sign and each second parameter having a characteristic;

each MCG1 codeword has an LZ which is smaller than or equal to an MCG classification parameter x;

each MCG2 codeword has an LZ which is greater than or equal to the MCG classification parameter x;

the sign of the first parameter of the codewords within the MCG1 is opposite to the sign of the first parameter of corresponding codewords within the MCG2;

the characteristic the second parameter is opposite to the characteristic of the second parameter of corresponding codewords within the MCG2;

the MCG1 and the MCG2 have no identical codewords;

each DCG1 and each DCG2 codeword has an LZ which is equal to or smaller than the difference between the maximum run length k and a codeword duplication parameter y while the sign of the first parameter and the characteristic of the second parameter for the DCG1 are opposite to the sign of the first parameter and the characteristic of the second parameter, respectively, for the DCG2;

the codewords are disposed in the DCG1 or the DCG2 depending on the values of specific bits of the codewords;

the sign of the first parameter of codewords in the first DSV code group is opposite to the sign of the first parameter of corresponding codewords in the MCG2 and the characteristic of the second parameter of codewords in the first DSV code group is opposite to the characteristic of the second parameter of corresponding codewords in the MCG2;

the sign of the first parameter of codewords in the second DSV code group is opposite to the sign of the first parameter of corresponding codewords in the DCG1 and the characteristic of the second parameter of the second DSV code group is opposite to the characteristic of the second parameter of corresponding codewords in the DCG1; and the sign of the first parameter of the codewords in the third DSV code group is opposite to the sign of the first parameter of corresponding codewords in the DCG2 and the characteristic of the second parameter of the codewords in the third DSV code group is opposite to the characteristic of the second parameter of corresponding codewords in the DCG2.

17. The method of claim 15, wherein in the modulating of the m-bit input data, if the run length condition (d,k) is satisfied, the m-bit input data is modulated into a codeword selected from a code group pair consisting of:

the MCG1 and the MCG2, the MCG2 and the first DSV code group, the DCG1 and the second DSV code group, or the DCG2 and the third DSV code group.

18. The method of claim 15, wherein the DC suppression control code group capable of controlling DC suppression together with the redundant code demodulation conversion code group is made up of codewords which violate the LZ condition among all of the codewords in the redundant code demodulation conversion code group.

19. The method of claim 18, wherein the number of lead zeros of all of the codewords within the redundant code demodulation conversion code group is less than or equal to 5, and the number of lead zeros of each of the codewords within the DC suppression control code group for controlling DC suppression together with the redundant code demodulation conversion code group is less than or equal to the maximum run length k.

20. The method of claim 15, wherein in the modulation of the m-bit input data, if it is determined in the searching for a codeword that the run length condition between a codeword to be currently modulated and the previous codeword/next codeword is satisfied and that the previous codeword has been modulated in one of the conversion code groups MCG1, MCG2, DCG1 and DCG2, a code group designated by the current modulated codeword as a code group having a codeword to come next to the current codeword is determined depending on a number of end zeros, EZ, of the previous codeword modulated in one of the conversion code groups, wherein:

if EZ is smaller than the minimum run length d, the main code group MCG1 is determined, if EZ is equal to or greater than d and smaller than or equal to a codeword duplication parameter y, the redundant code demodulation conversion code group DCG1 or DCG2 is determined depending on values of specific bits of the current codeword, and if EZ is greater than y, the MCG1 is determined.

21. The method of claim 20, wherein, if the previous codeword has been modulated in the main code group MCG1, where the previous codeword is 1000xxxxxx10 or 1001xxxxxx10, the main code group MCG1 is determined as a code group designated by the current codeword, from which a codeword to come next to the current codeword is to be selected.

22. The method of claim 15, wherein in the modulating of the m-input data, if it is determined in the searching for a codeword that the run length condition (d,k) between a codeword to be currently modulated and the previous codeword/next codeword is satisfied and the previous codeword has been modulated in one among the DSV code groups, a code group designated by the current modulated codeword as a code group having a codeword to come next to the current codeword is determined depending on the EZ of the previous codeword modulated in one among the DSV code groups, wherein:

if EZ is equal to or greater than 0 and smaller than the maximum run length k, the redundant code demodulation conversion code group DCG1 or DCG2 is determined depending on the values of specific bits of the current modulated codeword, and if EZ is the maximum run length k, the main code group MCG1 is determined.

23. A method of demodulating a codeword stream received by an optical recording/reproduction apparatus using a run length limited (RLL) code (d,k,m,n), where d denotes a minimum run length, k denotes a maximum run length, m denotes a bit length of data, and n denotes a bit length of a codeword, in which input data has been modulated into a codeword in a code group, which is favorable for DC suppression, from a predetermined number of first code groups for data modulation and a predetermined number of second code groups for DC suppression control, the first and second code groups having duplicate codewords and being produced so that the codewords within the first code group have a first parameter CSV (codeword sum value) which represents the direct current (DC) value of a codeword, the sign of which is opposite to that of corresponding codewords within the second code group, and a second parameter INV which predicts the digital sum value (DSV) transition direction of the next codeword, the characteristic of which is opposite to that of corresponding codewords within the second code group, and the first and second code groups have different duplicate codeword generation conditions, the method comprising:

updating a parameter NCG (next code group) designating a code group having a current codeword to be currently demodulated, depending on the characteristics of a previous codeword;

determining whether two identical current codewords in a code group designated by the updated parameter NCG; and demodulating the current codeword into the original data for a codeword in a code group designated by the third updated parameter NCG, if the current codeword does not have a duplicate, and demodulating the current codeword into original data for one of the two identical codewords selected depending on the LZ of the next codeword, if the current codeword has a duplicate.

24. The method of claim 23, wherein the codeword stream comprises codewords selected from a code group, which is favorable for DC suppression, of a code group pair for DC control among the pairs consisting of:

the main code groups MCG1 and MCG2, the main code group MCG2 and the first DSV code group for DC suppression control, the redundant code demodulation conversion code group DCG1, the second DSV code group for DC suppression control, and the redundant code demodulation conversion code group DCG2 and the third DSV code group for DC suppression control.

25. The method of claim 23, wherein the updating of the parameter NCG comprises:

determining whether the previous codeword is included in the data modulation code group;

checking a number of end zeros, EZ, of the previous codeword if it is determined that the previous codeword is included in the data modulation code group;

updating the parameter NCG to a first value that represents the main code group MCG2 or the first DSV code group, if the EZ of the previous codeword is smaller than the minimum run length d;

determining whether a code group designated by the parameter NCG of the previous codeword has two identical previous codewords, if the EZ of the previous codeword is equal to or greater than the minimum run length d and smaller than or equal to the codeword duplication parameter y;

updating the parameter NCG to a second value that represents the DCG1 or the second DSV code group or a third value that represents the DCG2 or the third DSV code group, depending on the values of specific bits of a current codeword, if it is determined that there are two identical previous codewords;

updating the parameter NCG to a fourth value that represents the MCG1 or the MCG2, if the EZ of the previous codeword is greater than the codeword duplication parameter y or if it is determined that the previous codeword does not have a duplicate; and determining whether the EZ of the previous codeword is the minimum run length k of the RLL code, if it is determined that the previous codeword is not included in the data modulation code group, and, if EZ equals k, returning to the updating of the parameter NCG to a fourth value, otherwise, returning the determining whether a code group designated by the parameter NCG of the previous codeword has two identical previous codewords.

26. The method of claim 25, wherein, in the updating of the parameter NCG to the second value, where d is 1, k is 8, m is 8, n is 12, a parameter x for classifying MCG1 and MCG2 is 1, the codeword duplication parameter y is 3, and the specific bits are the 4 upper bits of the current codeword, if the MSB of the current codeword is "1" or the 4 upper bits thereof are all "0", the parameter NCG is updated to the second value, otherwise, the parameter NCG is updated to the third value.

27. A method of producing run length limited (RLL) code groups for an RLL code having the form (d,k,m,n) where d is a minimum run length, k is a maximum run length, m is a data bit length, and n is a codeword bit length, the method comprising:

producing $2^n$ codewords;

selecting produced codewords which meet the minimum run length d and the maximum run length k;

extracting parameters LZ, EZ, CSV and INV from each selected codeword, wherein LZ is a number of lead zeros, EZ is a number of end zeros, CSV is a codeword sum value determined by summing the bits in the codeword bitstream by counting a 0 as −1 and a 1 as +1 and the parameter INV has a characteristic of 0 where an even number of 1s are included within the codeword or a characteristic of 1 where an odd number of 1s are included in the codeword;

comparing the EZ of each selected codeword with the minimum run length d and a codeword duplication parameter y and determining a next code group (NCG) based on the comparison; and storing each selected codeword relationally with the corresponding determined NCG in at least one of a plurality of codeword tables based on a comparison of the LZ of the codeword with a factor.

28. The method of claim 27, wherein the factor is a codeword classification parameter x and the storing further comprises:

storing each selected codeword and the corresponding determined NCG in a first main code group (MCG1), if the LZ of the codeword is less than or equal to x; and storing each selected codeword and the corresponding determined NCG in a second main code group (MCG2) so that a characteristic of INV and a sign of CSV are opposite the characteristic of INV and the sign of CSV, respectively, of a corresponding codeword in the MCG1, if the LZ of the codeword is greater than x.

29. The method of claim 28, wherein the factor is a difference between the maximum run length k and a codeword duplication parameter y, (k-y), and the storing further comprises:

storing each selected codeword and the corresponding determined NCG in a first decision code group (DCG1), if at least one of three particular bits of the codeword is 1 and the LZ of the codeword is less than or equal to (k-y); and storing each selected codeword and the corresponding determined NCG in a second decision code group (DCG2), if all of the three particular bits of the codeword are 1 and the LZ of the codeword is less than or equal to (k-y).

30. The method of claim 29, wherein the factor is a set of numbers corresponding to a predetermined number of lead zeros and the storing further comprises:
storing each selected codeword and the corresponding NCG in a first digital sum value group (DSVG1) so that the characteristic of INV and the sign of CSV of the codeword are opposite the characteristic of INV and the sign of CSV, respectively, of a corresponding codeword in the MCG2, if the LZ of the codeword is greater than or equal to one and less than or equal to eight;
storing each selected codeword and the corresponding NCG in a second digital sum value group (DSVG2) so that the characteristic of INV and the sign of CSV of the codeword are opposite to the characteristic of INV and the sign of CSV, respectively, of a corresponding codeword in the DCG1, if the LZ of the codeword equals 0, 6 or 7; and
storing the selected codeword and the NCG in a third digital sum value group (DSVG3) so that the characteristic of INV and the sign of CSV of the codeword are opposite to both the characteristic of INV and the sign of CSV of a corresponding codeword in the DCG1, if the LZ is greater than or equal to one and less than or equal to three.

31. A method of grouping codewords meeting a (d,k) condition of an RLL code having the form (d,k,m,n), where d is a minimum run length, k is a maximum run length, m is a data bit length, and n is a codeword bit length, the method comprising:
extracting parameters LZ, EZ, CSV and INV from each selected codeword, wherein LZ is a number of lead zeros, EZ is a number of end zeros, CSV is a codeword sum value determined by summing the bits in the codeword bitstream by counting a 0 as −1 and a 1 as +1 and the parameter INV has a characteristic of 0 where an even number of 1s are included within the codeword or a characteristic of 1 where an odd number of 1s are included in the codeword;
comparing the EZ of each selected codeword with the minimum run length d and a codeword duplication parameter y and determining a next code group (NCG) based on the comparison; and
storing each selected codeword relationally with the corresponding determined NCG in at least one of a plurality of codeword tables based on a comparison of the LZ of the codeword with a factor.

32. The method of claim 31, wherein the factor is a codeword classification parameter x and the storing further comprises:
storing each selected codeword and the corresponding determined NCG in a first main code group (MCG1), if the LZ of the codeword is less than or equal to x; and
storing each selected codeword and the corresponding determined NCG in a second main code group (MCG2) so that a characteristic of INV and a sign of CSV are opposite the characteristic of INV and the sign of CSV, respectively, of a corresponding codeword in the MCG1, if the LZ of the codeword is greater than x.

33. The method of claim 32, wherein the factor is a difference between the maximum run length k and a codeword duplication parameter y, (k-y), and the storing further comprises:
storing each selected codeword and the corresponding determined NCG in a first decision code group (DCG1), if at least one of three particular bits of the codeword is 1 and the LZ of the codeword is less than or equal to (k-y); and
storing each selected codeword and the corresponding determined NCG in a second decision code group (DCG2), if all of the three particular bits of the codeword are 1 and the LZ of the codeword is less than or equal to (k-y).

34. The method of claim 33, wherein the factor is a set of numbers corresponding to a predetermined number of lead zeros and the storing further comprises:
storing each selected codeword and the corresponding NCG in a first digital sum value group (DSVG1) so that the characteristic of INV and the sign of CSV of the codeword are opposite the characteristic of INV and the sign of CSV, respectively, of a corresponding codeword in the MCG2, if the LZ of the codeword is greater than or equal to one and less than or equal to eight;
storing each selected codeword and the corresponding NCG in a second digital sum value group (DSVG2) so that the characteristic of INV and the sign of CSV of the codeword are opposite to the characteristic of INV and the sign of CSV, respectively, of a corresponding codeword in the DCG1, if the LZ of the codeword equals 0, 6 or 7; and
storing the selected codeword and the NCG in a third digital sum value group (DSVG3) so that the characteristic of INV and the sign of CSV of the codeword are opposite to both the characteristic of INV and the sign of CSV of a corresponding codeword in the DCG1, if the LZ is greater than or equal to one and less than or equal to three.

* * * * *